(12) United States Patent
Cheng et al.

(10) Patent No.: US 7,732,872 B2
(45) Date of Patent: Jun. 8, 2010

(54) INTEGRATION SCHEME FOR MULTIPLE METAL GATE WORK FUNCTION STRUCTURES

(75) Inventors: Kangguo Cheng, Guilderland, NY (US); Michael P. Chudzik, Danbury, CT (US); Ramachandra Divakaruni, Ossining, NY (US); Geng Wang, Stormville, NY (US); Robert C. Wong, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 11/924,053

(22) Filed: Oct. 25, 2007

(65) Prior Publication Data

US 2009/0108356 A1    Apr. 30, 2009

(51) Int. Cl.
*H01L 27/088* (2006.01)
(52) U.S. Cl. .................. 257/391; 257/213; 257/365
(58) Field of Classification Search .............. 257/213, 257/365, 391, E29.264, E21.421, E21.159, 257/E29.126, E29.137; 438/652, 656, 657
See application file for complete search history.

(56) References Cited

U.S. PATENT DOCUMENTS

| | | | | |
|---|---|---|---|---|
| 6,140,684 | A * | 10/2000 | Chan et al. | 257/368 |
| 6,482,698 | B2 * | 11/2002 | Peschiaroli et al. | 438/257 |
| 6,506,676 | B2 * | 1/2003 | Park et al. | 438/683 |
| 6,518,106 | B2 * | 2/2003 | Ngai et al. | 438/157 |
| 6,569,742 | B1 * | 5/2003 | Taniguchi et al. | 438/303 |
| 6,642,132 | B2 | 11/2003 | Cho et al. | |
| 6,730,973 | B2 * | 5/2004 | Hibi et al. | 257/391 |
| 6,768,179 | B2 | 7/2004 | Cho et al. | |
| 6,835,987 | B2 * | 12/2004 | Yaegashi | 257/391 |
| 6,909,137 | B2 | 6/2005 | Divakaruni et al. | |
| 6,991,972 | B2 * | 1/2006 | Lochtefeld et al. | 438/149 |
| 7,157,359 | B2 | 1/2007 | Park et al. | |
| 2002/0086504 | A1 | 7/2002 | Park et al. | |
| 2002/0123189 | A1 * | 9/2002 | Cha et al. | 438/228 |
| 2004/0099885 | A1 * | 5/2004 | Yeo et al. | 257/208 |
| 2005/0098839 | A1 * | 5/2005 | Lee et al. | 257/410 |
| 2005/0136595 | A1 | 6/2005 | Horie | |
| 2005/0245045 | A1 * | 11/2005 | Shukuri et al. | 438/435 |
| 2005/0269634 | A1 | 12/2005 | Bojarczuk, Jr. et al. | |
| 2006/0024893 | A1 * | 2/2006 | Min et al. | 438/287 |

(Continued)

*Primary Examiner*—Leonardo Andújar
*Assistant Examiner*—Jordan Klein
(74) *Attorney, Agent, or Firm*—Scully, Scott, Murphy & Presser, P.C.; H. Daniel Schnurmann

(57) ABSTRACT

A metal gate stack containing a metal layer having a mid-band-gap work function is formed on a high-k gate dielectric layer. A threshold voltage adjustment oxide layer is formed over a portion of the high-k gate dielectric layer to provide devices having a work function near a first band gap edge, while another portion of the high-k dielectric layer remains free of the threshold voltage adjustment oxide layer. A gate stack containing a semiconductor oxide based gate dielectric and a doped polycrystalline semiconductor material may also be formed to provide a gate stack having a yet another work function located near a second band gap edge which is the opposite of the first band gap edge. A dense circuit containing transistors of p-type and n-type with the mid-band-gap work function are formed in the region containing the threshold voltage adjustment oxide layer.

14 Claims, 21 Drawing Sheets

U.S. PATENT DOCUMENTS

| | | |
|---|---|---|
| 2006/0081939 A1* | 4/2006 | Akasaka et al. ............. 257/371 |
| 2006/0163631 A1 | 7/2006 | Chen et al. |
| 2006/0228848 A1 | 10/2006 | Chan et al. |
| 2006/0244075 A1 | 11/2006 | Chen et al. |
| 2007/0020865 A1 | 1/2007 | Chen et al. |
| 2007/0023842 A1* | 2/2007 | Jung et al. .................. 257/369 |
| 2007/0040225 A1 | 2/2007 | Yang |
| 2007/0051996 A1 | 3/2007 | Chen et al. |
| 2007/0207575 A1 | 9/2007 | Taniguchi et al. |

* cited by examiner

INTEGRATION SCHEME FOR MULTIPLE METAL GATE WORK FUNCTION STRUCTURES

CROSS REFERENCE TO RELATED PATENT APPLICATIONS

This application is related to concurrently filed U.S. patent application Ser. No. 11/924,059 and U.S. patent application Ser. No. 11/924,045, all of common assignee, which cross-referenced applications are filed concurrently with the present application.

FIELD OF THE INVENTION

The present invention generally relates to semiconductor devices, and particularly to semiconductor devices having multiple metal gates having different work functions, and methods of manufacturing the same.

BACKGROUND OF THE INVENTION

High gate leakage current of nitrided silicon dioxide and depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

A high-k dielectric material needs to provide good electrical stability, that is, the amount of charge trapped in the high-k dielectric material needs to remain at a low level even after extended operation of a transistor. The high-k dielectric material needs to be scalable, that is, provide acceptable level of leakage and an acceptable level of electron and hole mobility at a reduced thickness, e.g., less than 1 nm. High-k dielectric materials satisfying these conditions may be advantageously employed for high performance semiconductor devices.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of about 4.0 eV is necessary for n-type metal oxide semiconductor field effect transistors (NMOSFETs, or "NFETs") and another conductive material having a work function of about 5.0 eV is necessary for p-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, suitable materials satisfying the work function requirements are needed.

While such an approach provides enhanced performance on discrete devices such as a PFET or an NFET, employing such an approach for circuits having a large number of PFETs and NFETs in high density necessarily requires a large "transition area" in which different stacks of metal gate stacks are adjoined during formation of metal gate stacks. Defect generation at the boundary of the different stacks of metal gate layers cause yield degradation. Further, a substantial fraction of a total circuit area needs to be used as the transition area, thus increasing the area of the circuit and reducing the density of the circuit.

Adverse impact of transition areas formed according to a conventional dual metal gate CMOS integration scheme on yield and device density may be particularly significant in high density circuits such as a static random access memory (SRAM) cell or a logic circuit requiring a high density.

In view of the above, there exists a need for semiconductor devices that do not require an excessive transition area, while providing benefits of a metal gate structure, and methods of manufacturing the same.

Further, there exists a need for semiconductor devices that do not require an excessive transition area and are compatible with other semiconductor devices having conventional dual metal gate CMOS integration structures, and methods of manufacturing the same.

SUMMARY OF THE INVENTION

The present invention addresses the needs described above by providing a metal gate structure having a mid-band-gap work function and compatible with dual metal gate CMOS structures having near-band-gap-edge work functions, and methods of manufacturing the same.

In the present invention, a metal gate stack containing a metal layer having a mid-band-gap work function is formed on a high-k gate dielectric layer. A threshold voltage adjustment oxide layer is formed over a portion of the high-k gate dielectric layer to provide devices having a work function near a first band gap edge, while another portion of the high-k dielectric layer remains free of the threshold voltage adjustment oxide layer so that the work function remains the same as the original mid-band-gap work function. A gate stack containing a semiconductor oxide based gate dielectric and a doped polycrystalline semiconductor material may also be formed to provide a gate stack having a yet another work function located near a second band gap edge which is the opposite of the first band gap edge. A dense circuit containing transistors of p-type and n-type with the mid-band-gap work function are formed in the region containing the threshold voltage adjustment oxide layer.

According to an aspect of the present invention, a semiconductor structure is provided, which comprises a first gate stack and a second gate stack, each located on a semiconductor substrate, wherein the first gate stack comprises:
a. a first high dielectric constant (high-k) material portion located on a first semiconductor portion of the semiconductor substrate and comprising a high-k material having a dielectric constant greater than 4.0;
b. a metal oxide portion vertically abutting the first high-k material portion and comprising a different material than the high-k material; and
c. a first conductive metal nitride portion vertically abutting the metal oxide portion and comprising a conductive metal nitride;
and wherein the second gate stack comprises:
d. a second high dielectric constant (high-k) material portion located on a second semiconductor portion of the semiconductor substrate and comprising the high-k material; and
e. a second conductive metal nitride portion vertically abutting the second high-k material portion and comprising the conductive metal nitride.

In one embodiment, the first semiconductor portion comprises a first semiconductor material and the second semiconductor portion comprises a second semiconductor material, and wherein the first gate stack has a first work function that is closer to one of band gap edges of the first semiconductor material than to a middle of band gap edges of the first semiconductor material, and wherein the second gate stack has a second work function that is closer to a middle of band gap edges of the second semiconductor material than to one of band gap edges of the second semiconductor material.

In another embodiment, the first semiconductor material and the second semiconductor material are the same. The first semiconductor material and the second semiconductor material may be, for example, silicon or silicon germanium.

In even another embodiment, the first gate stack further comprises a first polycrystalline semiconductor material portion vertically abutting the first conductive metal nitride portion and comprising a polycrystalline semiconductor material, and wherein the second gate stack further comprises a second polycrystalline semiconductor material portion vertically abutting the second conductive metal nitride portion and comprising the polycrystalline semiconductor material.

In yet another embodiment, the polycrystalline semiconductor material comprises doped silicon, a doped silicon germanium alloy, a doped silicon carbon alloy, or a doped silicon germanium carbon alloy.

In still another embodiment, the semiconductor structure comprises a third gate stack including:
  a. a semiconductor oxide based gate dielectric portion located on a third semiconductor portion of the semiconductor substrate and comprising a semiconductor oxide or a semiconductor oxynitride;
  b. a doped polycrystalline semiconductor material portion vertically abutting the semiconductor oxide based gate dielectric portion and comprising another polycrystalline semiconductor material; and
  c. a third polycrystalline semiconductor material portion vertically abutting the doped polycrystalline semiconductor material portion and comprising the polycrystalline semiconductor material.

In still yet another embodiment, the polycrystalline semiconductor material and the other polycrystalline semiconductor material are different.

In a further embodiment, the first semiconductor portion, the second semiconductor portion, and the third semiconductor portion comprise a same semiconductor material, and wherein the first gate stack has a first work function that is closer to a first band gap edge of the semiconductor material than to a middle of the first band gap edge and a second band gap edge of the semiconductor material, and wherein the second gate stack has a second work function that is closer to the middle of the band gap edges than to either of the band gap edges, and wherein the third gate stack has a third work function that is closer to the second band gap edge than the middle of the band gap edges, wherein the first band gap edge is one of a conduction band edge and a valence band edge and the second band gap edge is the other of the conduction band edge and the valence band edge.

In an even further embodiment, the first band gap is the conduction band, and the second band gap is the valence band, and wherein the semiconductor material comprises silicon.

In yet further embodiment, the semiconductor structure further comprises a fourth gate stack including:
  a. a third high dielectric constant (high-k) material portion located on a fourth semiconductor portion of the semiconductor substrate and comprising the high-k material;
  b. a third conductive metal nitride portion vertically abutting the third high-k material portion and comprising the conductive metal nitride; and
  c. a third polycrystalline semiconductor material portion vertically abutting the third conductive metal nitride portion and comprising the polycrystalline semiconductor material, wherein the second gate stack constitutes a gate of a p-type field effect transistor and the fourth gate stack constitutes a gate of an n-type field effect transistor.

According to another aspect of the present invention, another semiconductor structure comprises:
  a. at least one first conductivity type field effect transistor located on a semiconductor substrate;
  b. at least one second conductivity type field effect transistor located on the semiconductor substrate, wherein the second conductivity type is the opposite of the first conductivity type; and
  c. at least one static random access memory (SRAM) cell located on the semiconductor substrate, wherein gate stack structures having specific features of the present invention are employed in the at least one first conductivity field effect transistor, the at least one second conductivity type field effect transistor, and the at least one static random access memory (SRAM) cell.

According to yet another aspect of the present invention, yet another semiconductor structure comprises:
  a. at least one first conductivity type field effect transistor located on a semiconductor substrate;
  b. at least one second conductivity type field effect transistor located on the semiconductor substrate, wherein the second conductivity type is the opposite of the first conductivity type; and
  c. at least one dynamic random access memory (DRAM) cell located on the semiconductor substrate, wherein gate stack structures having specific features of the present invention are employed in the at least one first conductivity field effect transistor, the at least one second conductivity type field effect transistor, and the at least one dynamic random access memory (SRAM) cell.

According to still another aspect of the present invention, a method of manufacturing a semiconductor structure is provided, which comprises:
  a. forming a high dielectric constant (high-k) material layer comprising a high-k material having a dielectric constant greater than 4.0 on a semiconductor substrate;
  b. forming a metal oxide layer comprising a different material than the high-k material directly on the high-k material layer;
  c. removing a portion of the metal oxide layer in a first device region, while preserving another portion of the metal oxide layer in a second device region;
  d. forming a conductive metal nitride layer comprising a conductive metal nitride directly on the metal oxide layer and the high-k material layer;
  e. forming a first transistor containing a first gate stack in the first device region and a second transistor containing a second gate stack in the second device region, wherein the first gate stack includes a first conductive metal nitride portion comprising the conductive metal nitride and vertically abutting a metal oxide portion, and wherein the second gate stack includes a second conductive metal nitride portion comprising the conductive metal nitride and vertically abutting a high-k material portion comprising the high-k material.

In one embodiment, the method further comprises forming a polycrystalline semiconductor material layer directly on the conductive metal nitride layer.

In another embodiment, the method further comprises:
a. forming a semiconductor oxide based gate dielectric layer comprising a semiconductor oxide or a semiconductor oxynitride on a semiconductor substrate;
b. forming a doped polycrystalline semiconductor material layer on the semiconductor oxide based gate dielectric layer; and
c. removing the semiconductor oxide based gate dielectric layer and the doped polycrystalline semiconductor material layer from the first device region and the second device region, while protecting the semiconductor oxide based gate dielectric layer and the doped polycrystalline semiconductor material layer in a third device region prior to the forming of the high-k dielectric material layer.

In even another embodiment, the method further comprises forming a third transistor containing a third gate stack in the third device region, wherein the third gate stack comprises:
a. a semiconductor oxide based gate dielectric portion located on a third semiconductor portion of the semiconductor substrate and comprising the semiconductor oxide or the semiconductor oxynitride;
b. a doped polycrystalline semiconductor material portion vertically abutting the semiconductor oxide based gate dielectric portion and comprising the same material as the doped polycrystalline semiconductor material layer; and
c. a third polycrystalline semiconductor material portion vertically abutting the doped polycrystalline semiconductor material portion and comprising the same material as the polycrystalline semiconductor material layer.

In yet another embodiment, the method further comprises forming a fourth transistor containing a fourth gate stack in a fourth device region, wherein the fourth gate stack includes a third conductive metal nitride portion comprising the conductive metal nitride and vertically abutting another high-k material portion comprising the high-k material, wherein the second gate stack constitutes a gate of a p-type field effect transistor and the fourth gate stack constitutes a gate of an n-type field effect transistor.

According to still another aspect of the present invention, another method of manufacturing a semiconductor structure s provided which comprises:
a. forming a semiconductor oxide based gate dielectric layer comprising a semiconductor oxide or a semiconductor oxynitride on a semiconductor substrate;
b. forming a doped polycrystalline semiconductor material layer on the semiconductor oxide based gate dielectric layer;
c. forming a stack of a portion of the doped polycrystalline semiconductor material layer and a portion of the semiconductor oxide based gate dielectric layer in a first device region;
d. forming a high dielectric constant (high-k) material layer comprising a high-k material having a dielectric constant greater than 4.0 directly on the stack and the semiconductor substrate;
e. forming a metal oxide layer comprising a different material than the high-k material directly on the high-k material layer;
f. removing the metal oxide layer in the first device region and in a third device region, while preserving the metal oxide layer in a second device region;
g. forming a conductive metal nitride layer comprising a conductive metal nitride directly on the metal oxide layer and the high-k material layer; and
h. forming a first transistor containing a first gate stack in the first device region and a second transistor containing a second gate stack in the second device region and at least one array device containing a third gate stack in the third device region, wherein the first gate stack includes a semiconductor oxide based gate dielectric portion, and wherein the second gate stack includes a first conductive metal nitride portion comprising the conductive metal nitride and vertically abutting a metal oxide portion, and wherein the third gate stack includes a second conductive metal nitride portion comprising the conductive metal nitride and vertically abutting a high-k material portion comprising the high-k material.

In one embodiment, the at least one array device comprises at least one static random access memory (SRAM) cell.

In another embodiment, the at least one array device comprises at least one dynamic random access memory (DRAM) cell.

BRIEF DESCRIPTION OF THE DRAWINGS

FIGS. 14A-14C show the exemplary SRAM structure up to a CA level. FIGS. 15A-15C show the exemplary SRAM structure up to an M1 level. FIGS. 14A and 15A are top down views in which a middle-of-line (MOL) dielectric 170 and an M1 dielectric 180 are not shown. FIGS. 14B and 15B are vertical cross-sectional views of the exemplary SRAM structure along the plane B-B' showing the MOL dielectric 170. FIGS. 14C and 15C are vertical cross-sectional views of the exemplary SRAM structure along the plane C-C' showing the MOL dielectric 170 and the M1 dielectric 180.

DETAILED DESCRIPTION OF THE INVENTION

Figure 1:
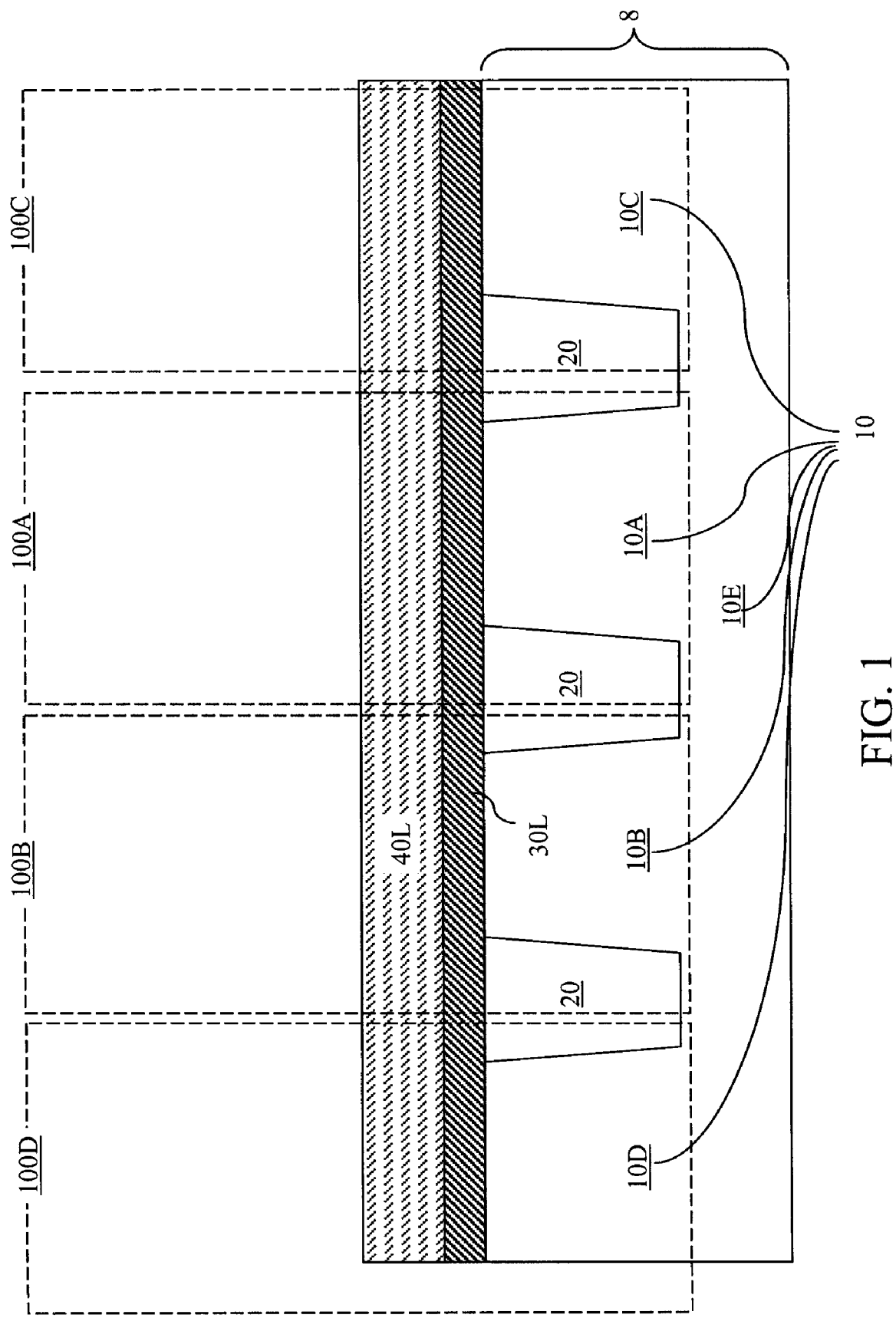
FIGS. 1-9 are sequential vertical cross-sectional views of a first exemplary semiconductor structure at various stages of a manufacturing process according to a first embodiment of the present invention.

As stated above, the present invention relates to semiconductor devices having multiple metal gates having different work functions, and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to a first embodiment of the present invention comprises a semiconductor substrate 8 containing a semiconductor region 10 and at least one shallow trench isolation (STI) structure 20. The first exemplary semiconductor structure comprises a first device region 100A, a second device region 100B, a third device region 100C, and a fourth device region 100D. Preferably, each of the device regions (100A-100D) is electrically separated from the rest of the device regions (100A-100D) by the at least one STI structure 20. The portion of the semiconductor region 10 in the first device region 100A is herein referred to as a first semiconductor portion 10A. Likewise, each portion of the semiconductor layer 10 in one of the second through fourth device regions (100B-100D) is herein referred to as a second, third, or fourth device region (10B-10D), respectively. The portion of the semiconductor layer below the level of bottom surfaces of the at least one STI structure 20 is herein referred to as a substrate semiconductor portion 10E. Thus, the semiconductor layer 10 comprises the first through fourth semiconductor portions (10A-10D) and the substrate semiconductor portion 10E.

Each of the first through fourth semiconductor portions (10A-10D) and the substrate semiconductor portion 10E comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Each of the semiconductor material of the first, second, third, and fourth semiconductor portions (10A, 10B, 10C, and 10D) is herein referred to as a first, second, third, and fourth semiconductor material, respectively. The first through fourth semiconductor materials may be the same, or alternatively, at least one of the first through fourth semiconductor materials may comprise a different semiconductor material than the rest. In one case, all portions of the semiconductor region 10 comprise the same semiconductor material such as silicon, i.e., the first through fourth semiconductor material are the same. Preferably, each of the first through fourth semiconductor portions (10A-10D) and the substrate semiconductor portion 10E is single crystalline, i.e., have the same crystallographic orientations throughout the volume of each. However, embodiments in which at least one of the first through fourth semiconductor portions (10A-10D) and the substrate semiconductor portion 10E is polycrystalline, for example, in the case of thin film transistors (TFTs), are also explicitly contemplated herein.

The semiconductor substrate 8 may be a bulk substrate, a semiconductor-on-insulator (SOI) substrate, or a hybrid substrate having a bulk portion and an SOI portion. While the first embodiment is described with a bulk substrate, embodiments employing an SOI substrate or a hybrid substrate are explicitly contemplated herein.

The semiconductor region 10 may include at least one doped region, each having a p-type doping or an n-type doping. For clarity, the at least one doped region is not specifically shown in the drawing of the present application. Each of the at least one doped region is known as a "well" and may be formed utilizing conventional ion implantation processes.

A semiconductor oxide based gate dielectric layer 30L is formed on exposed top surfaces of the semiconductor region 10. The semiconductor oxide based gate dielectric layer 30L comprises a semiconductor oxide or a semiconductor oxynitride. In case the semiconductor layer 10 comprises silicon, the semiconductor oxide based dielectric layer 30L may comprise silicon oxide or silicon oxynitride. The semiconductor oxide based dielectric layer 30L may be formed by thermal oxidation and optional thermal nitridation. Alternatively or additionally, chemical vapor deposition may be employed to form the semiconductor oxide based dielectric layer 30L. Methods of forming the semiconductor oxide based dielectric layer 30L are known in the art. The thickness of the semiconductor oxide based gate dielectric layer 30L is from about 1.0 nm to about 3 nm, although lesser and greater thickness are herein explicitly contemplated also.

A first polycrystalline semiconductor material layer 40L is formed directly on the semiconductor oxide based gate dielectric layer 30L. The first polycrystalline semiconductor material layer 40L comprises a polycrystalline semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. It is understood that an amorphous semiconductor material layer may be deposited and subsequently converted to the first polycrystalline semiconductor material layer 40L in a thermal anneal. The first polycrystalline semiconductor material layer 40L may be deposited with in-situ doping as a doped polycrystalline semiconductor material layer, or may be deposited as an undoped semiconductor material layer and subsequently doped by ion implantation. The thickness of the first polycrystalline semiconductor material layer 40L may be from about 10 nm to about 30 nm, although lesser and greater thicknesses are herein explicitly contemplated also.

Preferably, the material and the doping of the first polycrystalline semiconductor material layer 40L is optimized such that the work function of the first polycrystalline semiconductor material layer 40L, which is herein referred to as a third work function, is close to a first band gap edge of the third semiconductor material in the third semiconductor portion 10C. The first band gap edge is a conduction band edge or a valence band edge. Specifically, the third work function is closer to a first band gap edge of the third semiconductor material in the third semiconductor portion 10C than to a second band gap edge of the third semiconductor material. the second band gap edge is the opposite of the first band gap edge. If the first band gap edge is the valence band edge, the second band gap edge is the conduction band edge, and vice versa. Preferably, the third work function is closer to the first band gap edge of the third semiconductor material in the third semiconductor portion 10C than to a middle of the band gap edges of the third semiconductor material. For example, the third work function is closer to the valence band edge of the third semiconductor material that to the middle of the band gap edges of the third semiconductor material. The third semiconductor material may be silicon.

Figure 2:
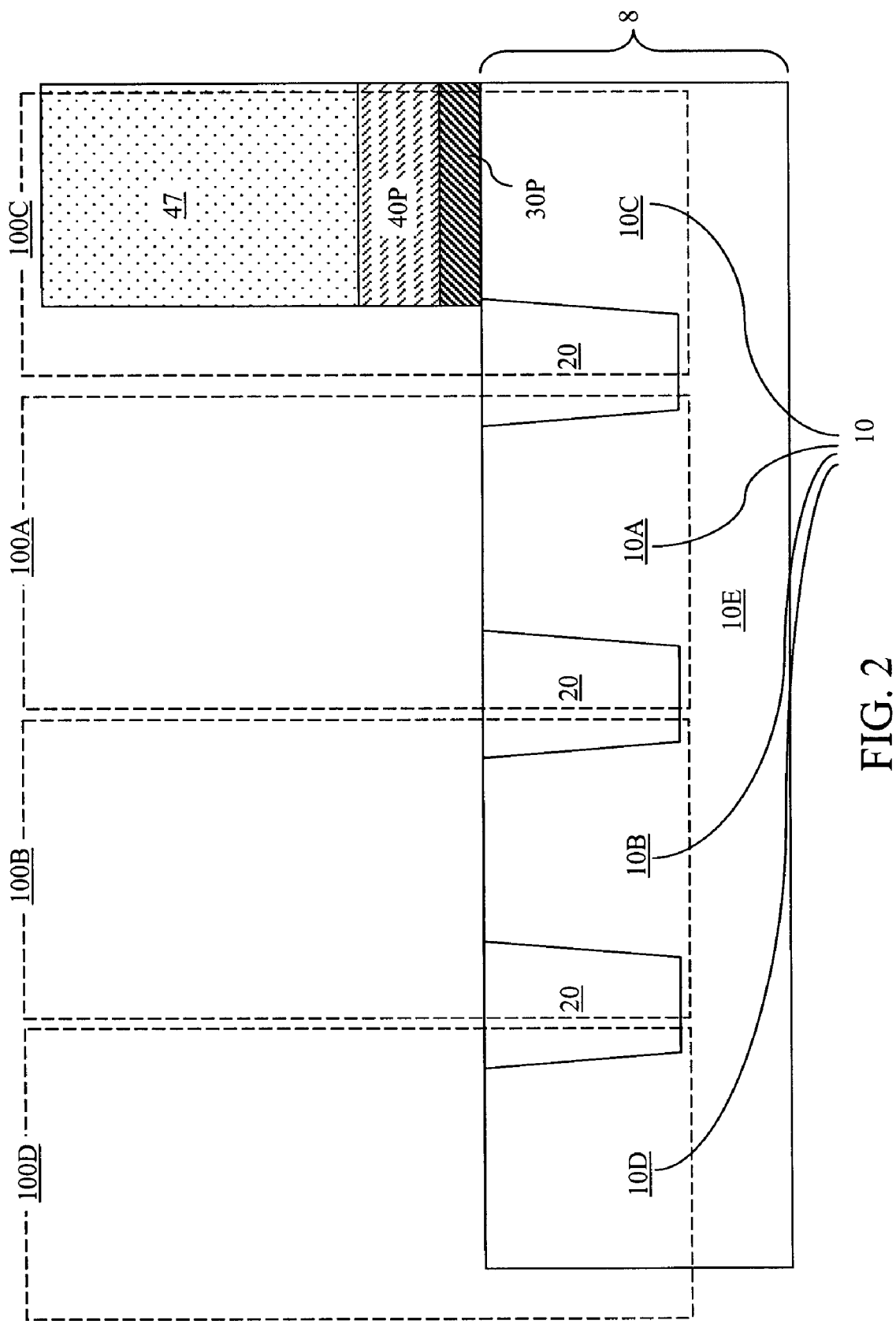

Referring to FIG. 2, a first photoresist 47 is applied over the first polycrystalline semiconductor material layer 40L and lithographically patterned to form a stack of a polycrystalline semiconductor material plate 40P and a semiconductor oxide based gate dielectric plate 30P over the third semiconductor portion 10C in the third device region 100C. A remaining portion the first polycrystalline semiconductor material layer 40L constitutes the polycrystalline semiconductor material plate 40P. A remaining portion of the semiconductor oxide based gate dielectric layer 30L constitutes the semiconductor oxide based gate dielectric plate 30P. The portions of the first polycrystalline semiconductor material layer 40L and the semiconductor oxide based gate dielectric layer 30L are removed from the first, second, and fourth device region (100A, 100B, 100D).

Figure 3:
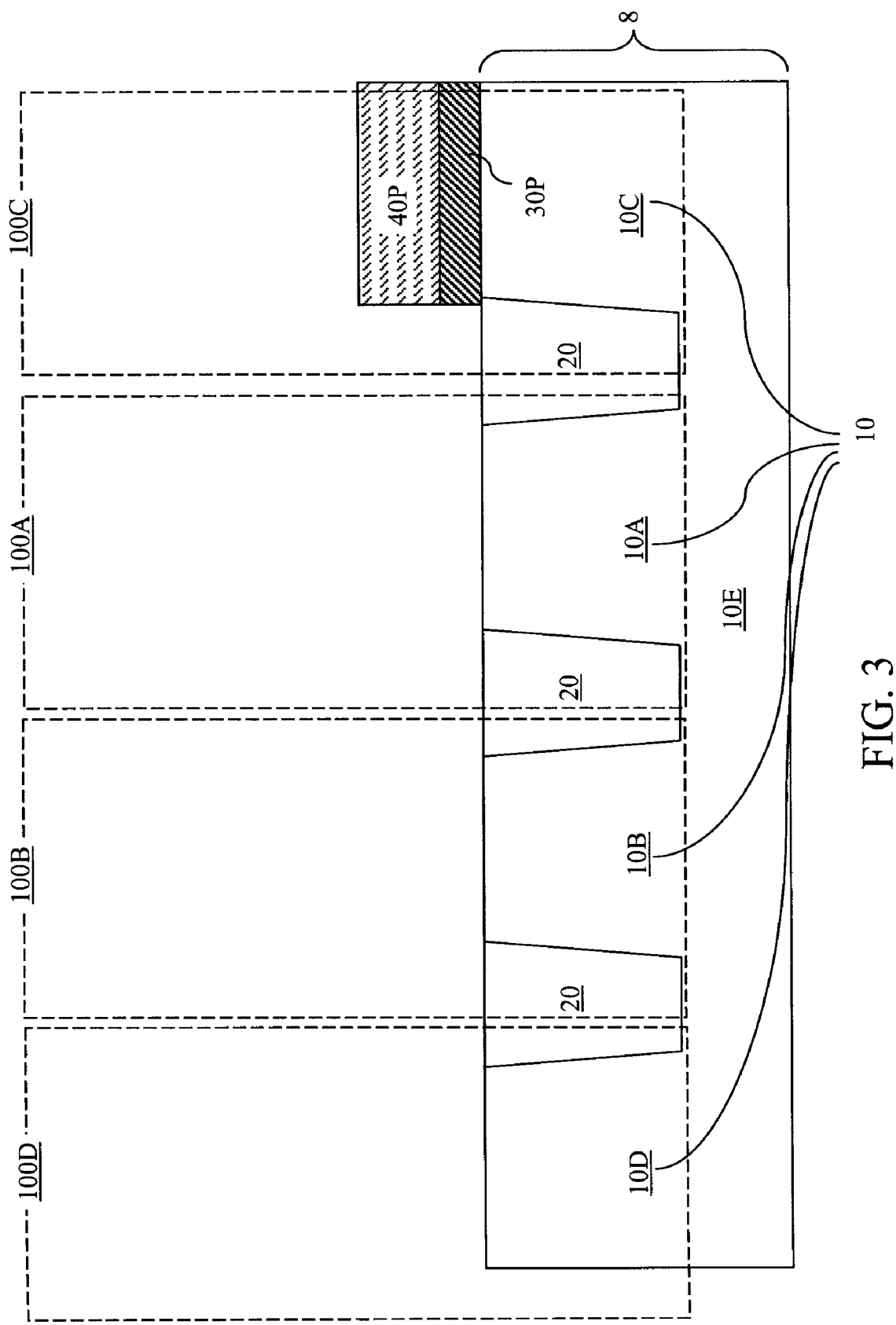

Referring to FIG. 3, the first photoresist 47 is subsequently removed, for example, by ashing. A suitable surface clean such as a wet clean may be performed at this point.

Figure 4:
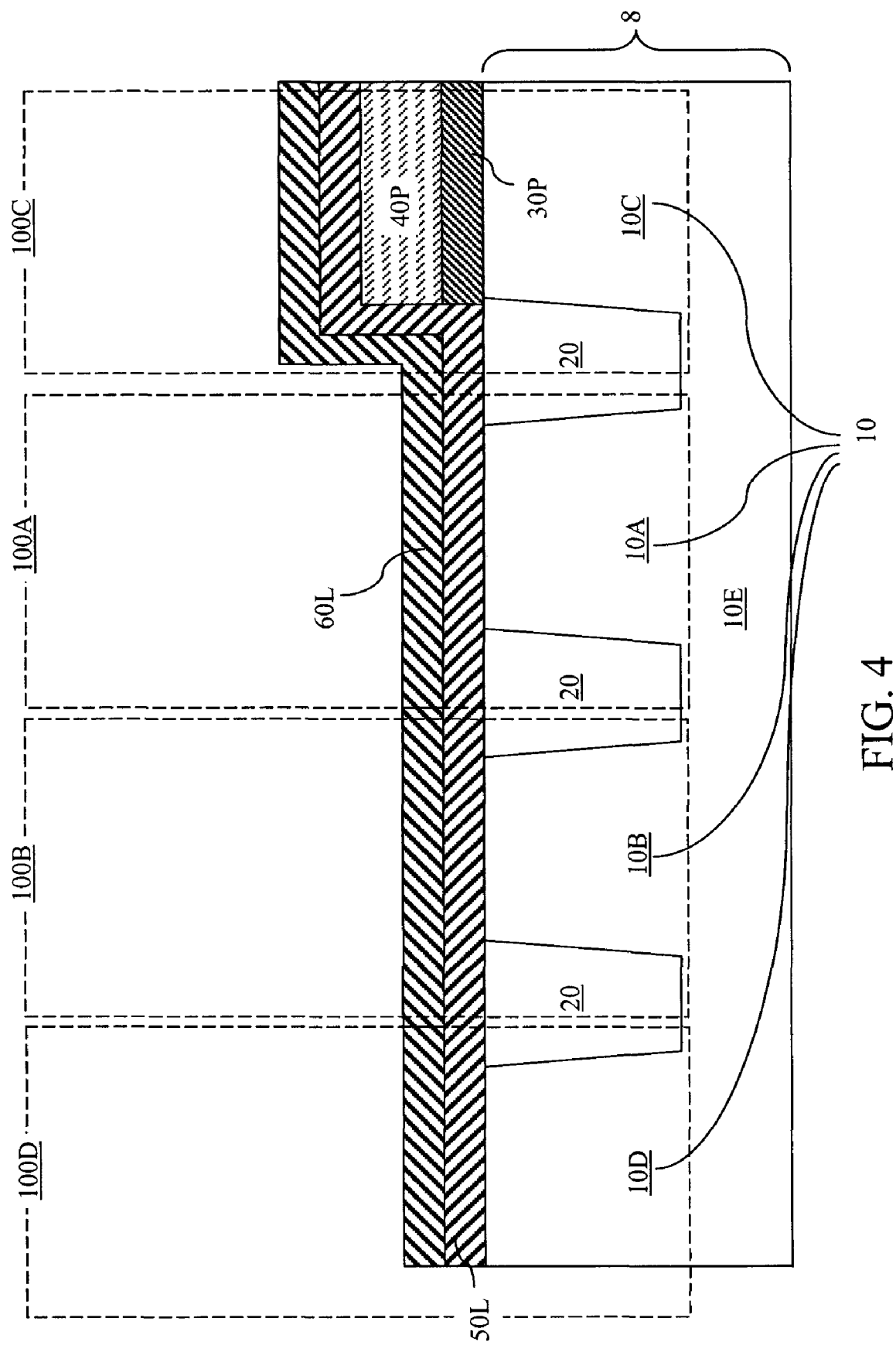

Referring to FIG. 4, a high dielectric constant (high-k) material layer 50L is formed on the exposed surfaces of the semiconductor substrate 8 and on the stack of the polycrystalline semiconductor material plate 40P and the semiconductor oxide based gate dielectric plate 30P. The high-k material layer 50L comprises a high-k material having a dielectric constant greater than 4.0. Preferably, the high-k material has a dielectric constant greater than 7.0, and more preferably, the high-k dielectric material has a dielectric constant greater than 10.0.

Optionally, a chemical oxide layer (not shown) may be formed directly on exposed surfaces of the semiconductor region 10 prior to formation of the high-k material layer 50. When the semiconductor region 10 comprises a silicon containing semiconductor material, the chemical oxide layer comprises silicon oxide, silicon oxynitride or a nitrided silicon oxide. When the semiconductor region 10 comprises another semiconductor material than a Si-containing semiconductor, the chemical oxide layer may comprise a semiconducting oxide, a semiconducting oxynitride or a nitrided semiconducting oxide. The thickness of the chemical oxide layer is typically from about 0.5 to about 1.2 nm, with a thickness from about 0.8 to about 1 nm being more typical. The thickness, however, may be different after processing at higher temperatures, which are usually required during CMOS fabrication. In the case the chemical oxide layer is a silicon oxide layer having a thickness from about 0.6 to about 0.8 nm, the chemical oxide layer may be formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to: 2 parts per million (ppm) to 40 ppm.

The high-k material layer 50L is formed directly on the chemical oxide layer, if present, or directly on exposed surfaces of the first, second, and fourth semiconductor portions (10A, 10B, 10D) by methods well known in the art including, for example, a chemical vapor deposition (CVD), a physical vapor deposition (PVD), molecular beam deposition (MBD), pulsed laser deposition (PLD), liquid source misted chemical deposition (LSMCD), atomic layer deposition (ALD), etc. The high-k material layer 50L comprises a dielectric metal oxide having a dielectric constant that is greater than the dielectric constant of silicon oxide of 4.0. The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the high-k dielectric layer 40L may be from about 2 nm to about 6 nm, and may have an effective oxide thickness on the order of or less than 1 nm. The thickness and composition of the high-k material layer 50L are optimized to tune work functions of gate stacks to be subsequently formed, as will be discussed below.

A metal oxide layer 60L is formed directly on the high-k material layer 50L. The metal oxide layer 60L may comprise a high-k material containing a metal and oxygen, known in the art as high-k gate dielectric materials. In this case, the metal oxide layer 60L may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Non-stoichiometric variants are also contemplated herein. The metal oxide layer 60L comprises a different material than the material of the high-k material layer 50L.

Alternately, the metal oxide layer 60L may comprise an alkaline earth metal-containing compound. Non-limiting examples of the alkaline earth metal-containing compound include MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, $BaI_2$, and an alloy thereof. Non-stoichiometric variants are also contemplated herein.

The metal oxide layer 60L alters the work function of the high-k material layer 50L, which affects threshold voltage of semiconductor devices. For this reason, the metal oxide layer 60L is also referred to as a threshold voltage adjustment oxide layer. The thickness of the metal oxide layer 60L may be from about 0.1 nm to about 0.5 nm, although lesser and greater thicknesses are explicitly contemplated herein. The thickness and composition of the metal oxide layer 60L are optimized to tune work functions of gate stacks to be subsequently formed, as will be discussed below.

Figure 5:
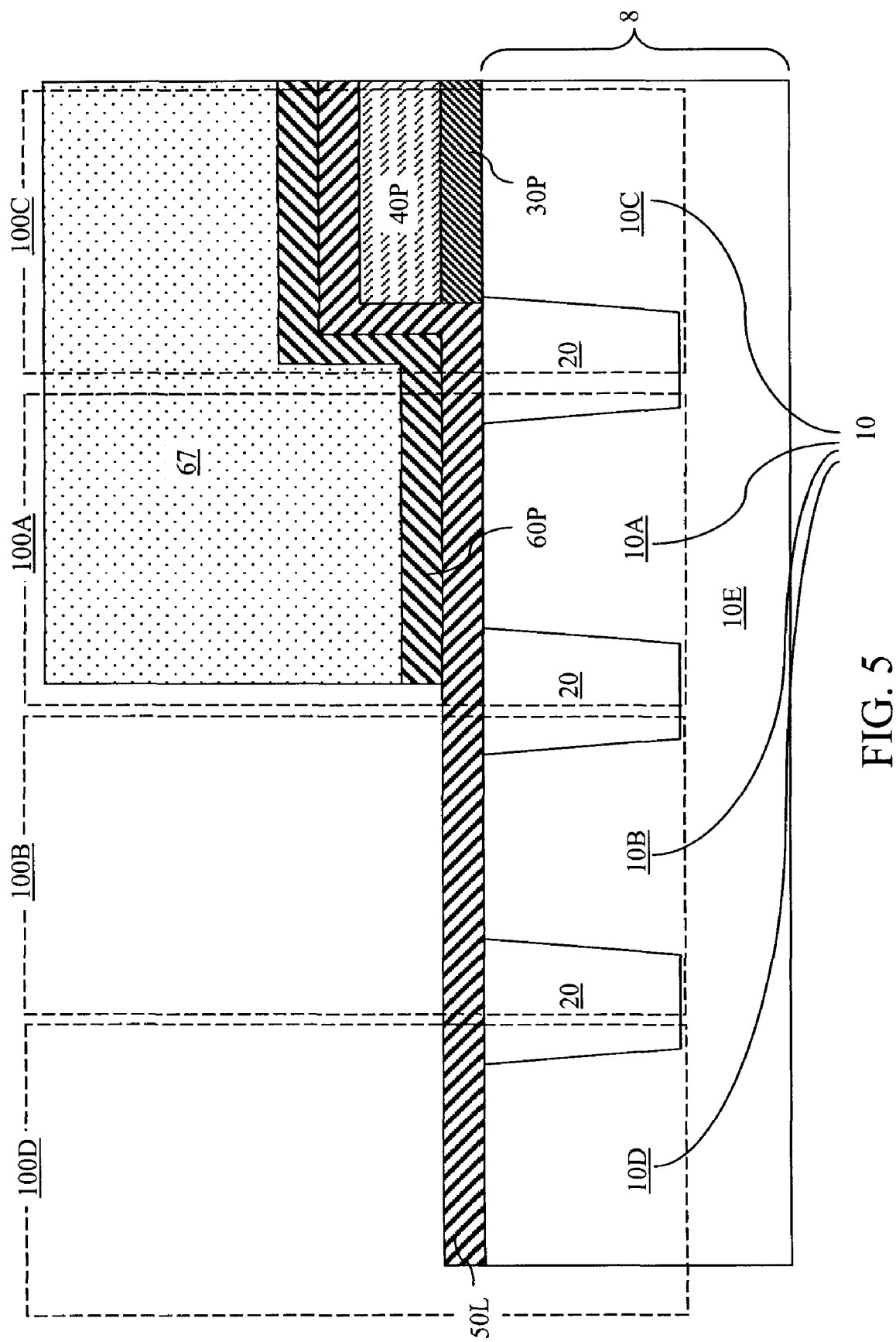

Referring to FIG. 5, a second photoresist is applied over the metal oxide layer 60L and lithographically patterned to cover the metal oxide layer 60L in the first device region 100A and the third device region 100C, while exposing the metal oxide layer 60L in the second device region 100B and the fourth device region 100D. The exposed portions of the metal oxide layer 60L in the second device region 100B and the fourth device region 100D are removed by an etch, which may be an isotropic etch such as a wet etch or an anisotropic etch such as a reactive ion etch. Preferably, the etch is selective to the high-k material layer 50L. A remaining portion the metal oxide layer 60L constitutes a metal oxide plate 60P. The second photoresist 67 is subsequently removed, for example, by ashing. A suitable surface clean such as a wet clean may be performed at this point.

Figure 6:
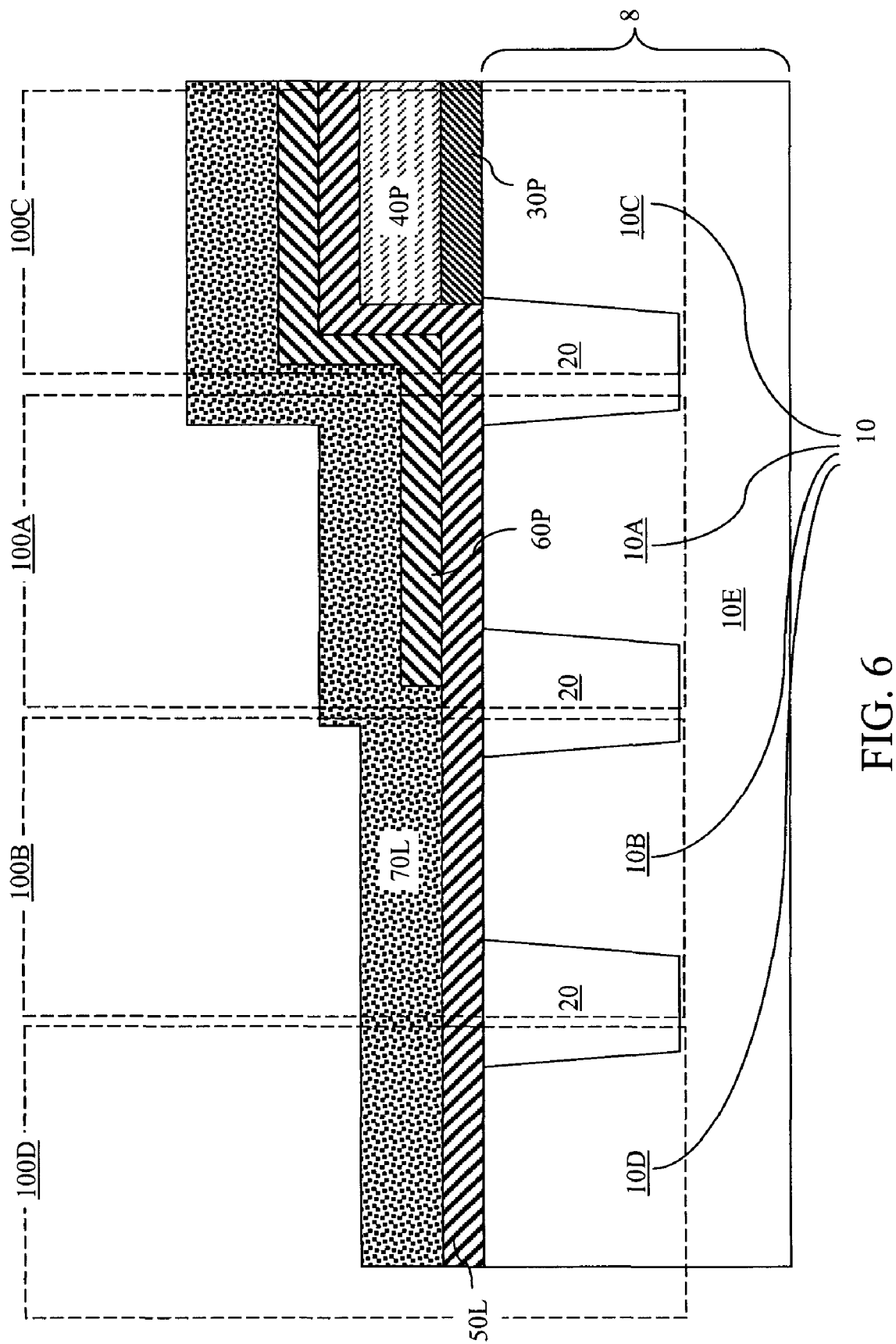

Referring to FIG. 6, a conductive metal nitride layer 70L is formed directly on the metal oxide plate 60P and the high-k material layer 50L. The conductive metal nitride layer 70L may comprise one of TiN, ZrN, HfN, VN, NbN, TaN, WN, TiAlN, TaCN, other conductive refractory metal nitrides, and an alloy thereof. The conductive metal nitride layer 70L may be formed by chemical vapor deposition (CVD), physical vapor deposition (PVD), atomic layer deposition (ALD), vacuum evaporation, etc. The conductive metal nitride layer 70L provides the functions of (a) protecting the metal oxide plate 60P and the high-k material layer 50L from the ambient, (b) blocking diffusion of ambient oxygen into the metal oxide plate 60P and the high-k material layer 50L, and (c) preventing reaction of the metal oxide plate 60P and the high-k material layer 50L with a polycrystalline semiconductor material to be subsequently formed on the conductive metal nitride layer 70. The conductive metal nitride layer 70L may comprise a metal from Group IVB or VB of the Periodic Table of Elements or other transition metals. By way of example, the conductive metal nitride layer 70L preferably comprises TiN or TaN. The thickness of the conductive metal nitride layer 70L may be from about 2 nm to about 40 nm, and preferably from about 3 nm to about 20 nm.

The high-k material layer 50L, the metal oxide layer 60L, and the conductive metal nitride layer 70L may be optimized such that the work function of the stack of the first high-k material layer 50L, the metal oxide layer 60L, and the conductive metal nitride layer 70L, which is herein referred to as a first work function, is close to the second band gap edge of the first semiconductor material in the first semiconductor portion 10A. The composition and thickness of each layer may be optimized for this purpose.

Thus, if the third work function is closer to the conduction band edge of the third semiconductor material in the third semiconductor portion 10C than to valence band edge of the third semiconductor material, the first work function is closer to the valence band edge of the first semiconductor material in the first semiconductor portion 10A than to the conduction band edge of the first semiconductor material. If the third work function is closer to the valence band edge of the third semiconductor material in the third semiconductor portion 10C than to the conduction band edge of the third semiconductor material, the first work function is closer to the conduction band edge of the first semiconductor material in the first semiconductor portion 10A than to the valence band edge of the first semiconductor material. In case the first semiconductor material and the third semiconductor material are the same, the band structure including the conduction band edge and the valence band edge is the same between the first semiconductor material and the third semiconductor material. The first and third semiconductor materials may be silicon.

Further, the high-k material layer 50L and the conductive metal nitride layer 70L may be optimized such that the work function of the stack of the first high-k material layer 50L and the conductive metal nitride layer 70L, which is herein referred to as a second work function, is close to a middle of a conduction band edge and a valence band edge of the second semiconductor material in the second semiconductor portion 10B. Thus, the second work function may be a "mid-band-gap work function," i.e., a work function having a value corresponding to a middle of the band gap, or having a value that is closer to the middle of the band gap than to either the conduction band edge or to the valence band edge.

Figure 7:
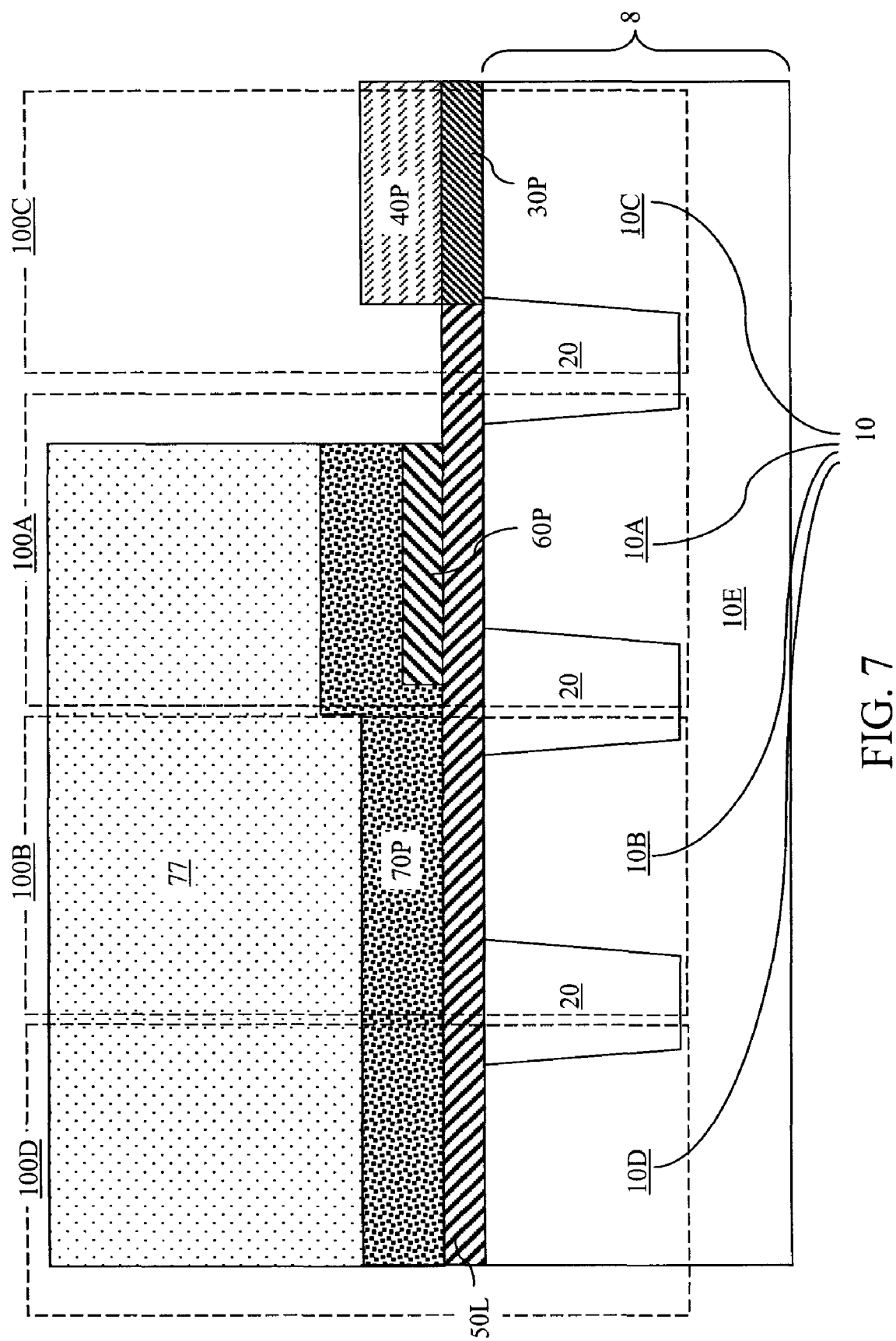

Referring to FIG. 7, a third photoresist 77 is applied over the conductive metal nitride layer 70L and lithographically patterned to cover the portions of the conductive metal nitride layer 70L in the first, second, and fourth device regions (100A, 100B, 100D), while exposing the portion of the conductive metal nitride layer 70L in the third device region 100C. Exposed portions of the metal nitride layer 70L is removed by an etch, which may be a reactive ion etch. Further, the portion of the metal oxide plate 60P and the high-k material layer 50L is removed from above the stack of the polycrystalline semiconductor material plate 40P and the semiconductor oxide based gate dielectric plate 30P in the third device region 100C. The high-k material layer 50L may, or may not, be completely removed from outside the region covered by the third photoresist 77. The remaining portion of the conductive metal nitride layer 70L beneath the third photoresist 77 constitutes a conductive metal nitride plate 70P. The third photoresist 77 is subsequently removed, and a suitable surface clean such as a wet clean may be performed at this point.

Figure 8:
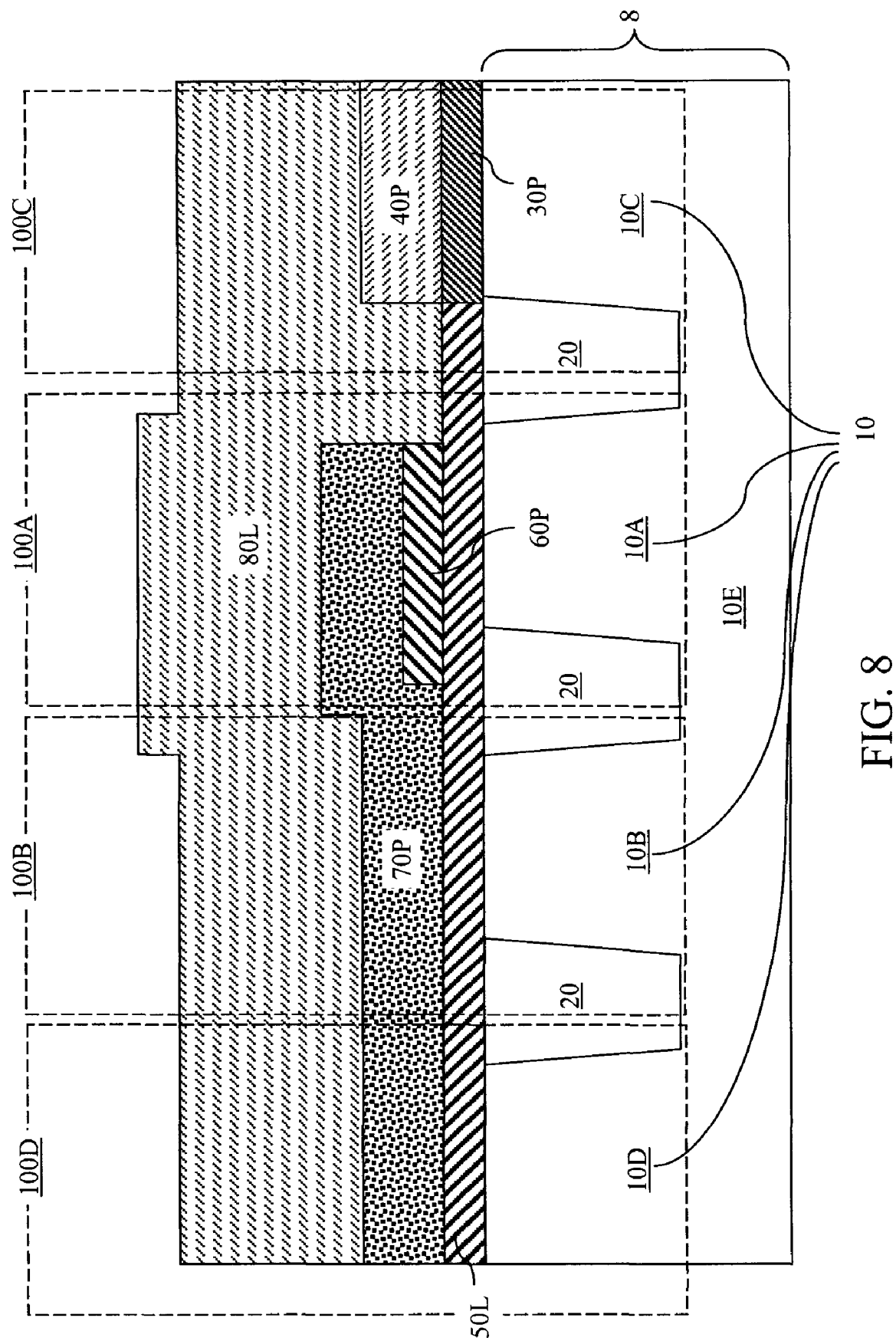

Referring to FIG. 8, a second polycrystalline semiconductor material layer 80L is formed on exposed surfaces, which comprises a top surface of the conductive metal nitride plate 70 in the first, second, and fourth device region (100A, 100B, 100D) and a top surface of the polycrystalline semiconductor material plate 40P. The second polycrystalline semiconductor material layer 80L comprises a polycrystalline semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. It is understood that an amorphous semiconductor material layer may be deposited and subsequently converted to the second polycrystalline semiconductor material layer 80L in a thermal anneal. The second polycrystalline semiconductor material layer 80L may be deposited with in-situ doping as a doped polycrystalline semiconductor material layer, or may be deposited as an undoped semiconductor material layer and subsequently doped by ion implantation. The thickness of the second polycrystalline semiconductor material layer 80L may be from about 30 nm to about 150 nm, although lesser and greater thicknesses are herein explicitly contemplated also.

Figure 9:
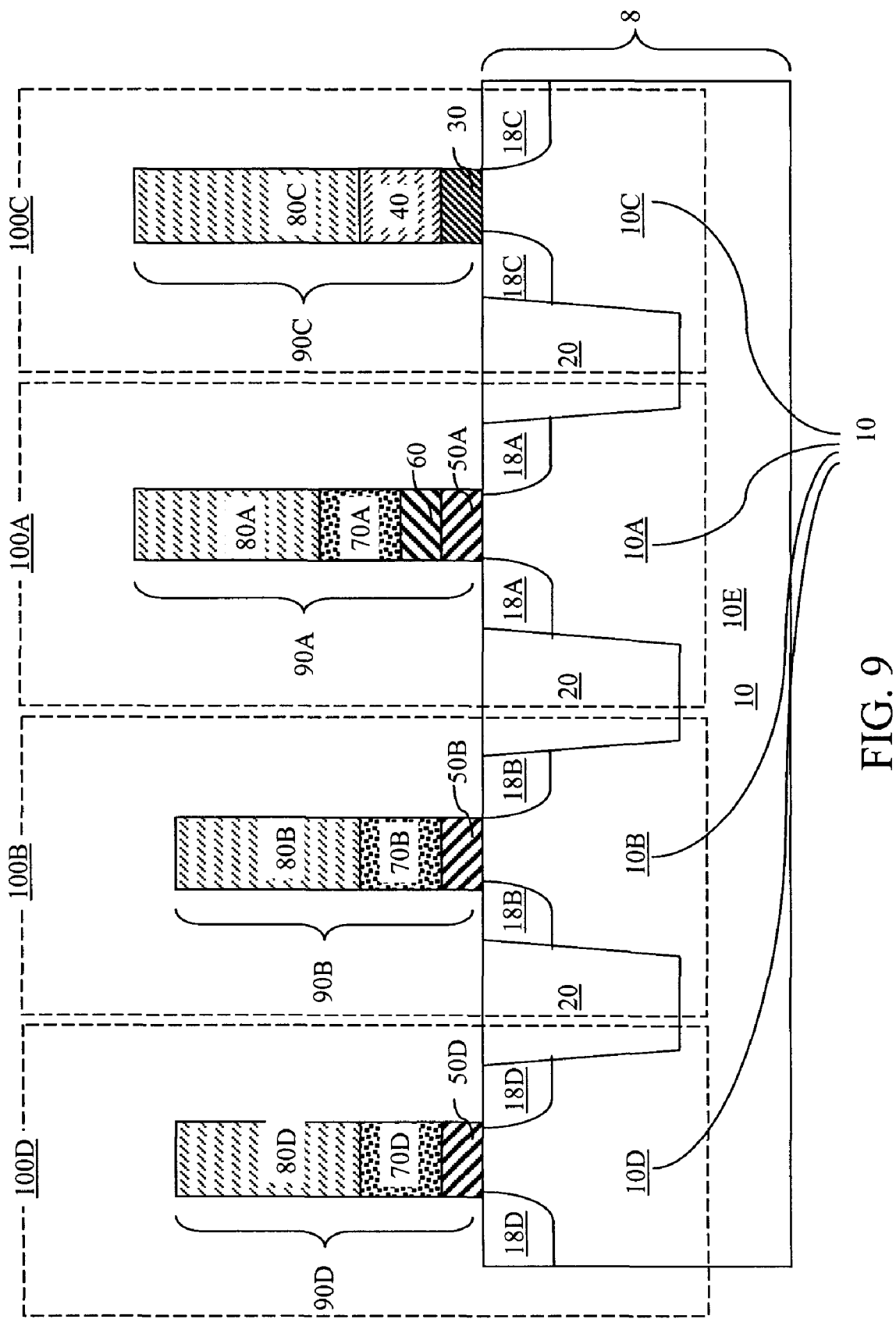

Referring to FIG. 9, the various layers and plates above a top surface of the semiconductor substrate 8 are patterned by lithographic methods and at least one etch to form various gate stacks in the various device regions (100A-100D). Specifically, a first gate stack 90A is formed in the first device region 100A; a second gate stack 90B is formed in the second device region 100B; a third gate stack is formed in the third device region 100C; and a fourth gate stack is formed in the fourth device region 100D.

The first gate stack 90A comprises:
a. a first high dielectric constant (high-k) material portion 50A located on a first semiconductor portion 10A of the semiconductor substrate 8 and comprising a high-k material having a dielectric constant greater than 4.0;
b. a metal oxide portion 60 vertically abutting the first high-k material portion 50A and comprising a different material than the high-k material;
c. a first conductive metal nitride portion 70A vertically abutting the metal oxide portion 60 and comprising a conductive metal nitride; and
d. a first polycrystalline semiconductor material portion 80A vertically abutting the first conductive metal nitride portion 70A and comprising a polycrystalline semiconductor material, which is the second polycrystalline semiconductor material.

The second gate stack 90B comprises:
a. a second high dielectric constant (high-k) material portion 100B located on a second semiconductor portion 10B of the semiconductor substrate 8 and comprising the high-k material;
b. a second conductive metal nitride portion 70B vertically abutting the second high-k material portion 50B and comprising the conductive metal nitride; and
c. a second polycrystalline semiconductor material portion 80B vertically abutting the second conductive metal nitride portion 70B and comprising the polycrystalline semiconductor material.

The third gate stack 90C comprises:
a. a semiconductor oxide based gate dielectric portion 30 located on a third semiconductor portion 10C of the semiconductor substrate 8 and comprising a semiconductor oxide or a semiconductor oxynitride;
b. a doped polycrystalline semiconductor material portion 40 vertically abutting the semiconductor oxide based gate dielectric portion 30 and comprising another polycrystalline semiconductor material, which is the first polycrystalline semiconductor material; and c. a third polycrystalline semiconductor material portion 80C vertically abutting the doped polycrystalline semiconductor material portion 40 and comprising the polycrystalline semiconductor material, which is the second polycrystalline semiconductor material.

The fourth gate stack 90D comprises:

a. a third high dielectric constant (high-k) material portion 50D located on a fourth semiconductor portion 10D of the semiconductor substrate 8 and comprising the high-k material;

b. a third conductive metal nitride portion 70D vertically abutting the third high-k material portion 50D and comprising the conductive metal nitride; and c. a fourth polycrystalline semiconductor material portion 80D vertically abutting the third conductive metal nitride portion 70D and comprising the polycrystalline semiconductor material, which is the second polycrystalline semiconductor material.

Source and drain regions are formed in each of the first, second, third, and fourth device regions. Specifically, first source and drain regions 18A are formed in the first semiconductor portion 10A; second source and drain regions 18B are formed in the second semiconductor portion 10B; third source and drain regions 18C are formed in the third semiconductor portion 10C; and fourth source and drain regions 18D are formed in the fourth semiconductor portion 10D.

The work function of the first gate stack 90A is substantially the same as the first work function. The work function of the second gate stack 90B is substantially the same as the second work function. The work function of the third gate stack 90C is substantially the same as the third work function. The work function of the fourth gate stack 90D is substantially the same as the second work function. Thus, the pair of the first gate stack 90A and the third gate stack 90C has a work function near a conduction band edge and another work function near a valence band edge. Specifically, the third work function is closer to the first band gap edge than to the second band gap edge of a semiconductor material. The first work function is closer to the second band gap edge than to the first band gap edge of another semiconductor material, which may be the same as, or different from, the semiconductor material having the first set of band gap edges.

For example, the first gate stack 90A may constitute a gate of n-type field effect transistor and the third gate stack 90C may constitute a gate of a p-type field effect transistor. In this case, the first work function, which is the work function of the first gate stack 90A, is close to a conduction band edge of the first semiconductor material of the first semiconductor portion 10A. Likewise, the third work function, which is the work function of the third gate stack 90C, is close to a valence band edge of the third semiconductor material of the third semiconductor portion 10C. The first semiconductor material may be the same as the third semiconductor material. The first semiconductor material and the third semiconductor material may be silicon. Complementary metal oxide semiconductor (CMOS) circuits employing near-band-gap-edge work functions may be formed in the first and third device regions (100A, 100C).

The work function of the second gate stack 90B and the work function of the fourth gate stack 90D are the same. The second gate stack 90B may constitute a gate of a p-type field effect transistor and the fourth gate stack 90D may constitute a gate of an n-type field effect transistor. CMOS circuits employing a mid-band-gap work function across p-type transistors and n-type transistors may be formed in the second and fourth device regions (100B, 100D).

Figure 10:
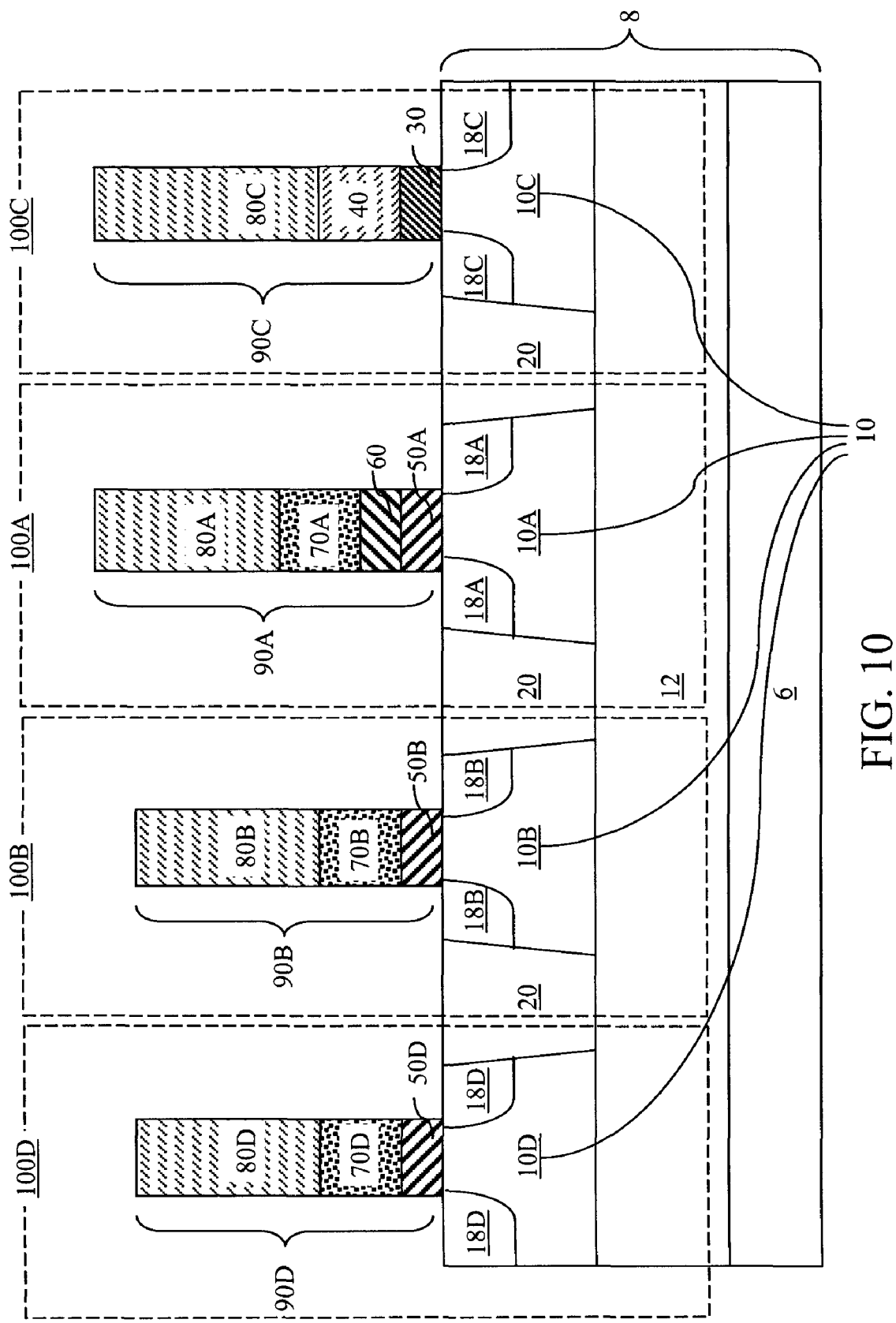
FIG. 10 is a vertical cross-sectional view of a second exemplary semiconductor structure according to a second embodiment of the present invention.

Referring to FIG. 10, a second exemplary semiconductor structure according to a second embodiment of the present invention comprises a semiconductor substrate 8, which is a semiconductor-on-insulator (SOI) substrate. The semiconductor substrate 8 includes a handle substrate 6, a buried insulator layer 12, and a semiconductor region 10. The semiconductor region 10 comprises a first semiconductor portion 10A, a second semiconductor portion 10B, a third semiconductor portion 10C, and a fourth semiconductor portion 10D. The same processing steps may be employed on the SOI substrate as in the first embodiment to form the second exemplary semiconductor structure of the second embodiment.

Figure 11A:
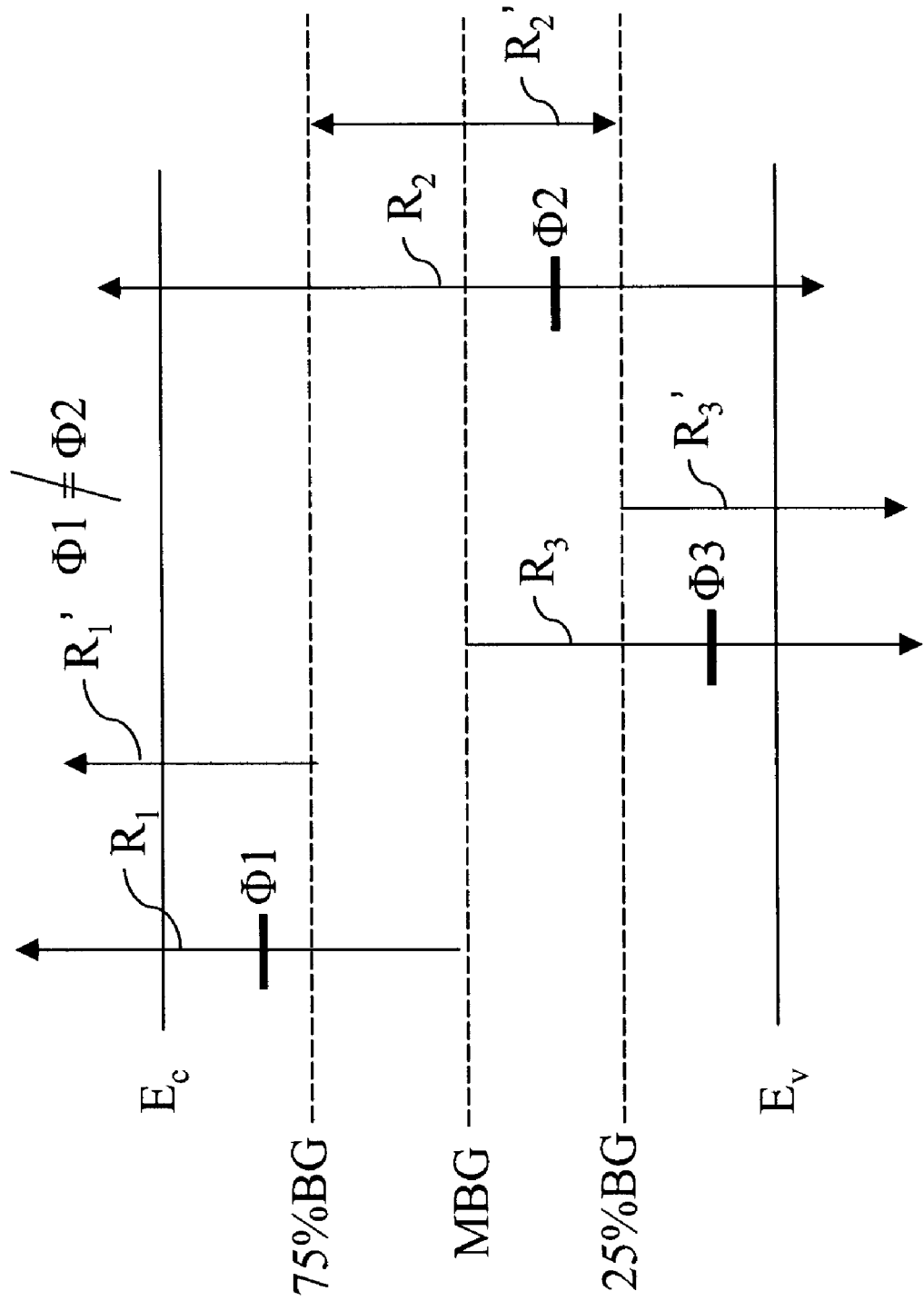
FIGS. 11A and 11B are band gap diagrams showing work functions of various gate stacks according to the present invention.

Referring to FIG. 11A, a first exemplary band gap diagram is shown, which corresponds to a case of the first or second embodiment in which the first, second, third, and fourth semiconductor materials are the same. Thus, the band gap structure is the same across the first, second, third, and fourth semiconductor portions (10A-10D). The valence band edge is labeled $E_v$, the conduction band edge is labeled $E_c$, the mid-band-gap level labeled MBG, a 25% level of the band gap is labeled 25% BG, and a 75% level of the band gap is labeled 75% BG. The mid-band-gap level the middle of the valence band edge and the conduction band edge. The range of the first work function $\Phi1$, which is the first range $R_1$, is above the MBG. The preferred range of the first work function $\Phi1$, which is the first preferred range $R_1'$, is above the 75% BG line, i.e., closer to the conduction band edge $E_c$ than to the middle of the band gap edges MBG. The range of the third work function $\Phi3$, which is the third range $R_3$, is below the MBG. The preferred range of the third work function $\Phi3$, which is the third preferred range $R_3'$, is below the 25% BG line, i.e., closer to the valence band edge $E_v$ than to the middle of the band gap edges MBG. The range of the second work function $\Phi2$, which is the second range $R_2$, encompasses the band gap, the conduction band including the conduction band edge, and the valence band including the valence band edge. The preferred range of the second work function $\Phi2$, which is the second preferred range $R_2'$, is between the 25% BG line and the 75% BG line, i.e., closer to the middle of the band gap edges MBG than to the conduction band edge $E_c$ or to the valence band edge $E_v$. The second work function $\Phi2$ is different from the first work function $\Phi1$, and preferably $(\Phi2-\Phi1)\times(\Phi3-\Phi1)$ is positive, i.e., the second work function $\Phi2$ and the third work function $\Phi3$ are one the same side relative to the first work function $\Phi1$. A fourth work function $\Phi4$, which is the work function of the fourth semiconductor material in the fourth semiconductor portion, is the same as the second work function $\Phi2$. Embodiments in which the first range $R_1'$ and the third range $R_3$ are reversed are also explicitly contemplated herein.

Figure 11B:
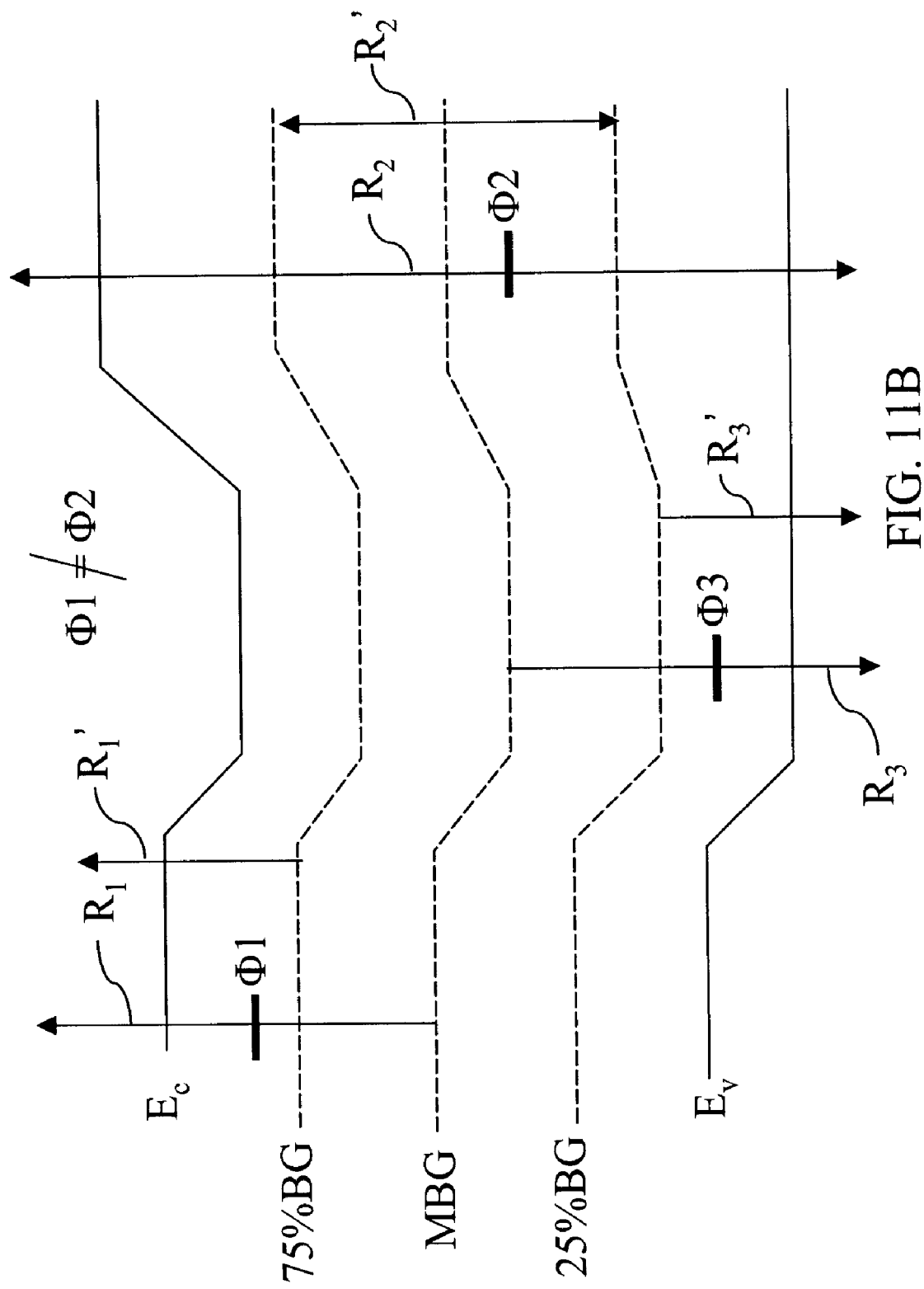

Referring to FIG. 11B, a second exemplary band gap diagram is shown, which corresponds to another case of the first or second embodiment in which each of the first, second, and third semiconductor materials is different from the rest. The fourth semiconductor material is the same as the second semiconductor material. Thus, the band gap structure is different across the first, second, and third semiconductor portions (10A-10C). The valence band edge is labeled $E_v$, the conduction band edge is labeled $E_c$, the middle of the band gap edges is labeled MBG, a 25% level of the band gap is labeled 25% BG, and a 75% level of the band gap is labeled 75% BG. The energy level of each of the lines representing various elements of the band structure varies with the semiconductor material. While each of the first range $R_1$, the second range $R_2$, the third range $R_3$, the first preferred range $R_1'$, the second preferred range R₂', and the third preferred range R₃' has the same characteristics relative to the various elements of the band structure as in the first exemplary band gap, each preferred range needs to be determined locally due to the local variation of the band gap structure. Further, variations in the band structure may also be effected by stress engineering even when a same semiconductor material is employed across the first through fourth semiconductor portions (10A-10C).

Figure 12:
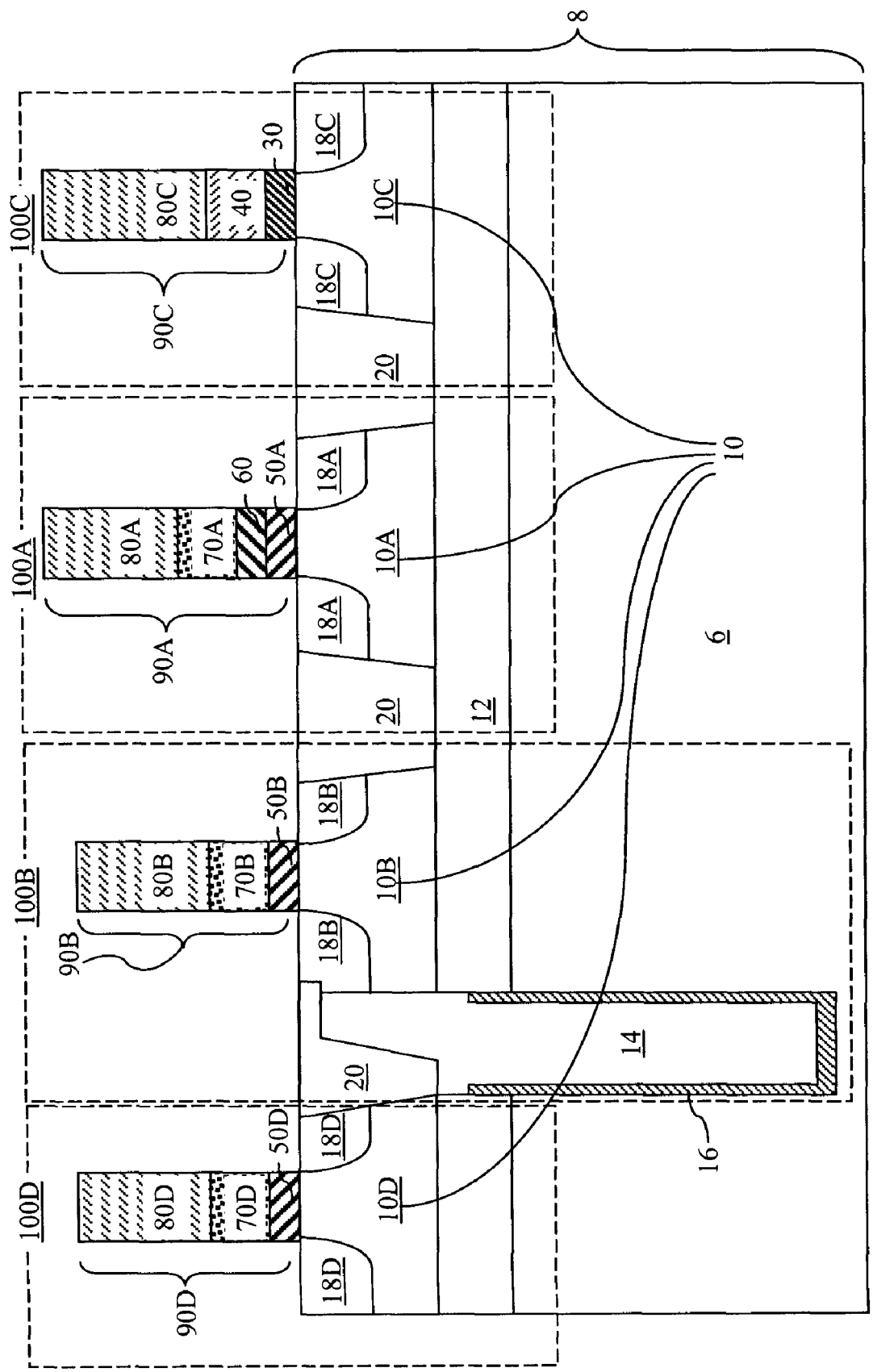
FIG. 12 is a vertical cross-sectional view of a third exemplary semiconductor structure containing a dynamic random access memory (DRAM) cell according to a third embodiment of the present invention.

Referring to FIG. 12, a third exemplary semiconductor structure according to a third element of the present invention comprises at least one dynamic random access memory cell formed in one of semiconductor portions. Specifically, a dynamic random access memory cell comprising a trench capacitor electrode 14 and a capacitor node dielectric 16 may be formed in a second device region 100B on a semiconductor substrate 8. A bulk substrate or a semiconductor-on-insulator (SOI) substrate including a buried insulator layer 12 may be employed.

The third exemplary semiconductor structure comprises:
a. at least one first conductivity type field effect transistor located on a semiconductor substrate 8;
b. at least one second conductivity type field effect transistor located on the semiconductor substrate 8, wherein the second conductivity type is the opposite of the first conductivity type; and
c. at least one dynamic random access memory (DRAM) cell located on the semiconductor substrate, wherein the at least one first conductivity type field effect transistor includes a first gate stack 90A including:
d. a first high dielectric constant (high-k) material portion 50A located on a first semiconductor portion 10A of the semiconductor substrate 8 and comprising a high-k material having a dielectric constant greater than 4.0;
e. a metal oxide portion 60 vertically abutting the first high-k material portion 50A and comprising a different material than the high-k material;
f. a first conductive metal nitride portion 70A vertically abutting the metal oxide portion 60 and comprising a conductive metal nitride; and
g. a first polycrystalline semiconductor material portion 80A vertically abutting the first conductive metal nitride portion 70A and comprising a polycrystalline semiconductor material, which is the second polycrystalline semiconductor material, and wherein the at least one second conductivity type field effect transistor includes another gate stack, which is a third gate stack 90C, including:
h. a semiconductor oxide based gate dielectric portion 30 located on another semiconductor portion, which is a third semiconductor portion 10C, of the semiconductor substrate 8 and comprising a semiconductor oxide or a semiconductor oxynitride;
i. a doped polycrystalline semiconductor material portion 40 vertically abutting the semiconductor oxide based gate dielectric portion 30 and comprising another polycrystalline semiconductor material, which is the first polycrystalline semiconductor material; and
j. another polycrystalline semiconductor material portion, which is a third polycrystalline semiconductor material portion 80C, vertically abutting the doped polycrystalline semiconductor material portion 40 and comprising the polycrystalline semiconductor material, which is the second polycrystalline semiconductor material, and wherein each of the at least one dynamic random access memory cell is located on yet another semiconductor portion, which is the second semiconductor portion 10B, of the semiconductor substrate 8 and includes:

k. a second high dielectric constant (high-k) material portion 50B comprising the high-k material;
l. a second conductive metal nitride portion 70B vertically abutting the second high-k material portion 50B and comprising the conductive metal nitride; and
m. a second polycrystalline semiconductor material portion 80B vertically abutting the second conductive metal nitride portion 70B and comprising the polycrystalline semiconductor material.

It is noted herein that the labeling of the various gate stacks as first through fourth gate stacks is only for purposes of distinguishing each one from the rest, and that the labels may be exchanged provided that elements incorporated within each gate stack changes with the changes in the labels. For example, a third gate stack 90C may be referred to as a "second gate stack" provided that the new second gate stack contains all of the elements of the third gate stack 90C. Likewise, the labeling of the various semiconductor portions as first through fourth semiconductor portions is also only for purposes of distinguishing each one from the rest, and the labels may be exchanged provided that physical regions referenced by each label are consistently changed with the label change. Thus, a third semiconductor portion 10C may be referred to as a "second semiconductor portion" provided that the new second semiconductor portion contains the same region as the third semiconductor portion 10C.

Figure 13:
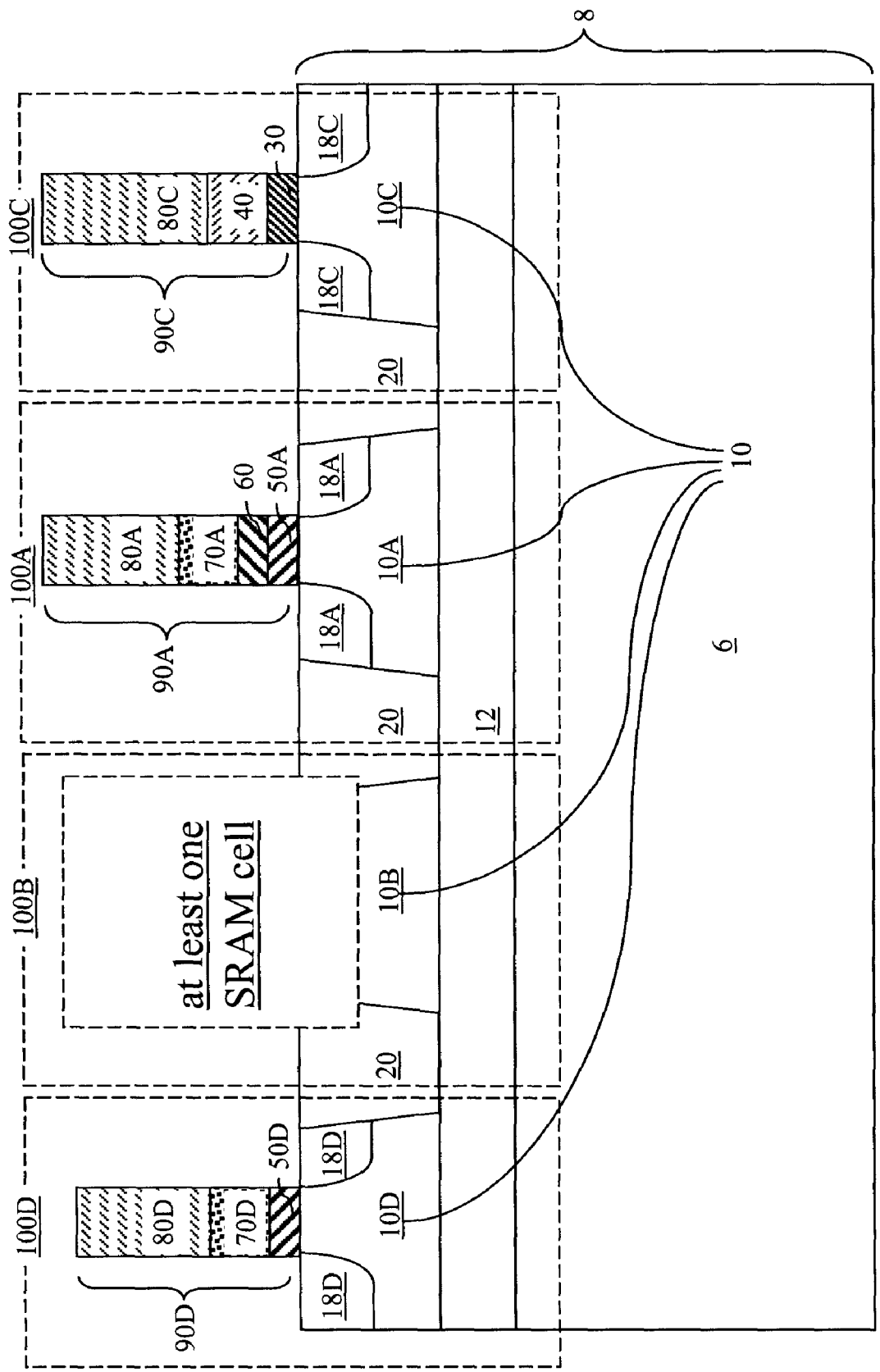
FIG. 13 is a vertical cross-sectional view of a fourth exemplary semiconductor structure containing at least one static random access memory (SRAM) cell according to a fourth embodiment of the present invention.

Referring to FIG. 13, a fourth exemplary semiconductor structure according to a fourth element of the present invention comprises at least one static random access memory cell formed in one of semiconductor portions. Specifically, at least one static random access memory cell may be formed in a second device region 100B on a semiconductor substrate 8. A bulk substrate or a semiconductor-on-insulator (SOI) substrate including a buried insulator layer 12 may be employed.

The third exemplary semiconductor structure comprises:
a. at least one first conductivity type field effect transistor located on a semiconductor substrate 8;
b. at least one second conductivity type field effect transistor located on the semiconductor substrate 8, wherein the second conductivity type is the opposite of the first conductivity type; and
c. at least one dynamic random access memory (DRAM) cell located on the semiconductor substrate, wherein the at least one first conductivity type field effect transistor includes a first gate stack 90A including:
d. a first high dielectric constant (high-k) material portion 50A located on a first semiconductor portion 10A of the semiconductor substrate 8 and comprising a high-k material having a dielectric constant greater than 4.0;
e. a metal oxide portion 60 vertically abutting the first high-k material portion 50A and comprising a different material than the high-k material;
f. a first conductive metal nitride portion 70A vertically abutting the metal oxide portion 60 and comprising a conductive metal nitride; and
g. a first polycrystalline semiconductor material portion 80A vertically abutting the first conductive metal nitride portion 70A and comprising a polycrystalline semiconductor material, which is the second polycrystalline semiconductor material, and wherein the at least one second conductivity type field effect transistor includes another gate stack, which is a third gate stack 90C, including:
h. a semiconductor oxide based gate dielectric portion 30 located on another semiconductor portion, which is a third semiconductor portion 10C, of the semiconductor substrate 8 and comprising a semiconductor oxide or a semiconductor oxynitride;
  i. a doped polycrystalline semiconductor material portion 40 vertically abutting the semiconductor oxide based gate dielectric portion 30 and comprising another polycrystalline semiconductor material, which is the first polycrystalline semiconductor material; and
  j. another polycrystalline semiconductor material portion, which is a third polycrystalline semiconductor material portion 80C, vertically abutting the doped polycrystalline semiconductor material portion 40 and comprising the polycrystalline semiconductor material, which is the second polycrystalline semiconductor material, and wherein each of the at least one static random access memory cell is located on yet another semiconductor portion, which is the second semiconductor portion 10B, of the semiconductor substrate 8 and includes:
  k. a pair of pull-down n-type field effect transistor;
  l. a pair of pull-up p-type field effect transistor; and
  m. a pair of pass gate n-type field effect transistor,
wherein each of the six field effect transistors comprises yet another gate stack, which is a second gate stack 90B (See FIGS. 9 and 10), comprising:
  n. a second high dielectric constant (high-k) material portion 50B (See FIGS. 9 and 10) comprising the high-k material;
  o. a second conductive metal nitride portion 70B (See FIGS. 9 and 10) vertically abutting the second high-k material portion 50B and comprising the conductive metal nitride; and
  p. a second polycrystalline semiconductor material portion 80B (See FIGS. 9 and 10) vertically abutting the second conductive metal nitride portion 70B and comprising the polycrystalline semiconductor material.

Figure 14A:
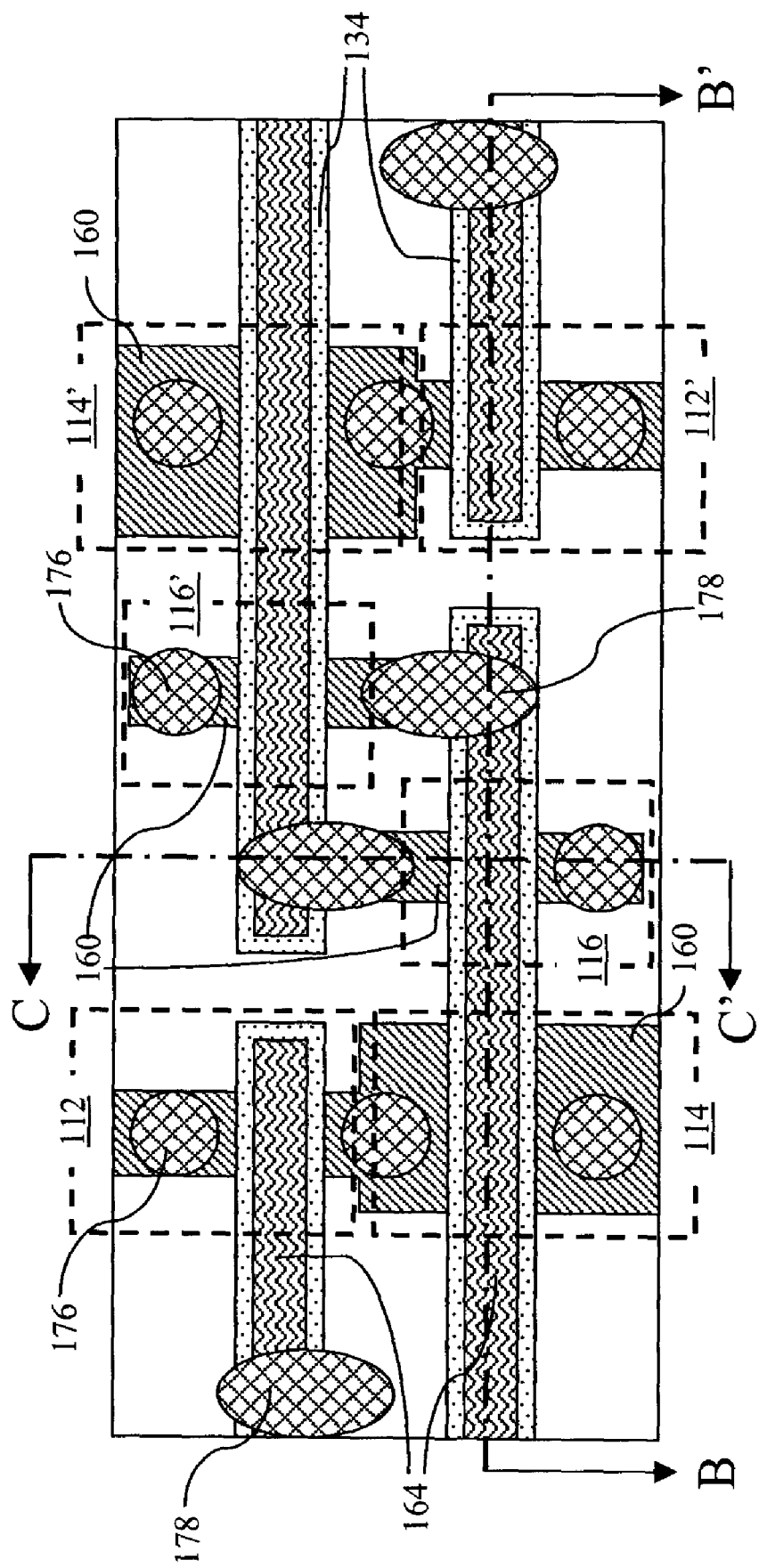
FIGS. 14A-14C and 15A-15C show an exemplary SRAM structure according to the present invention.
Figure 14B:
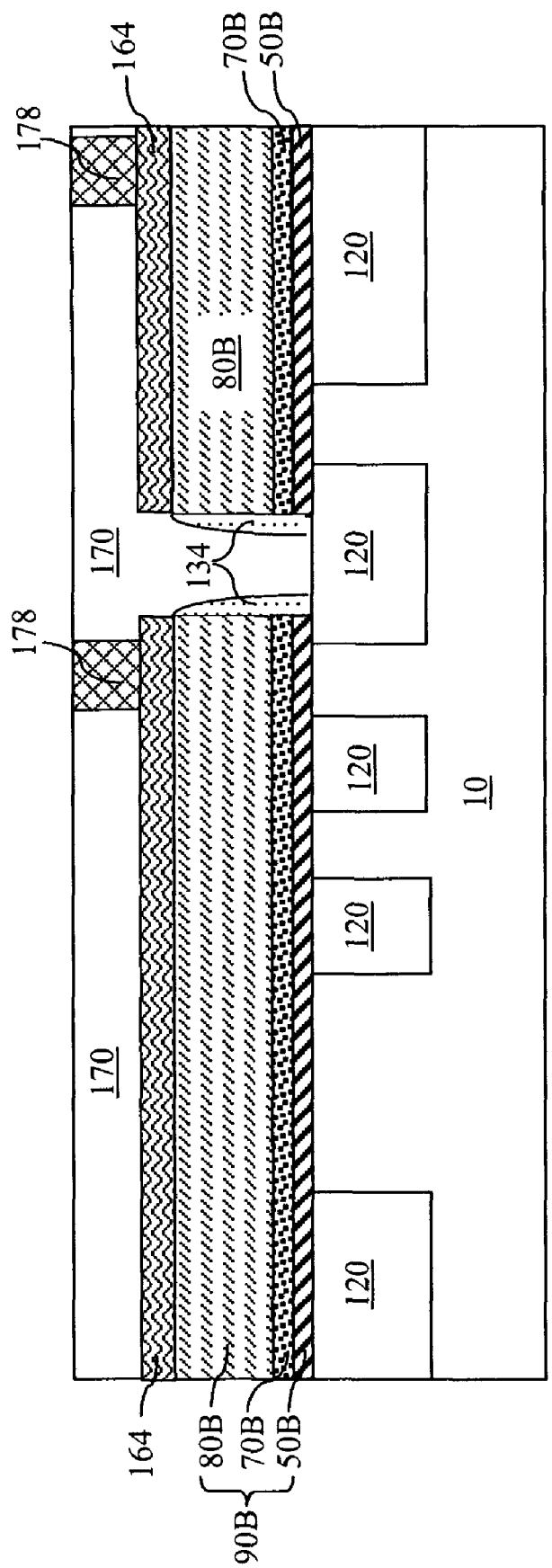
Figure 14C:
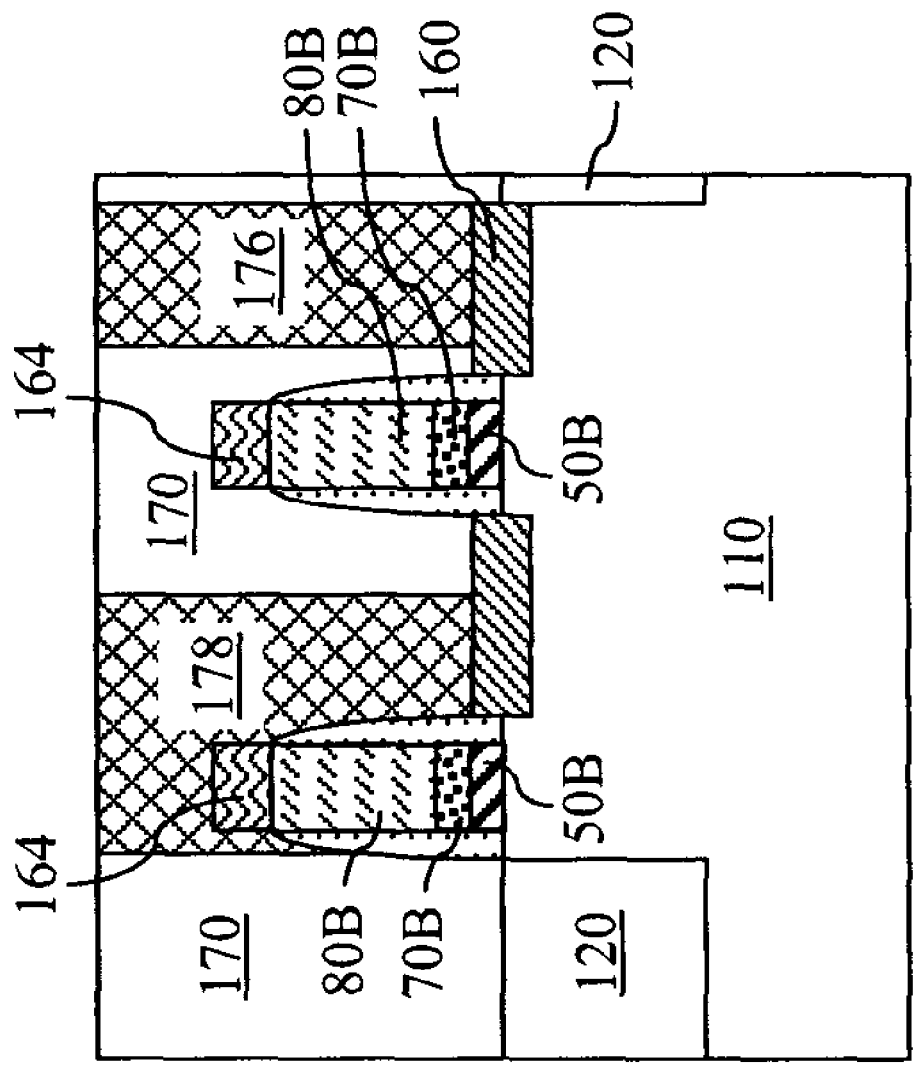

Referring to FIGS. 14A-14C, an exemplary static random access memory (SRAM) cell according to the present invention comprises a first pull-up PFET 116, a second pull-up PFET 116', two pull down NFETs (114, 114'), and two pass gate NFETs (112, 112'). FIG. 14A is a top-down view of the exemplary SRAM cell up to the CA level not showing a middle-of-line (MOL) dielectric 170. FIG. 14B is a vertical cross-sectional view of the exemplary SRAM cell along the plane B-B' showing the MOL dielectric 170. FIG. 14C is a vertical cross-sectional view of the exemplary SRAM cell along the plane C-C' showing the MOL dielectric 170. Each of the transistors (112, 112', 114, 114', 116, 116') comprise a portion of the semiconductor substrate 110, a portion of a second gate stack 90B, a gate spacer 134, active area (AA) silicides 160, and gate top silicides 164.

The second gate stack 90B comprises a second high-k material portion 50B, a second conductive metal nitride portion 70B, and a second polycrystalline semiconductor material portion 80B. The second conductive metal nitride portion 70B vertically abuts the second high-k material portion 50B and the second polycrystalline semiconductor material portion 80B in the exemplary SRAM cell.

A shallow trench isolation structure 120 physically separates the transistors (112, 112', 114, 114', 116, 116') and provides electrical isolation among the transistors (112, 112', 114, 114', 116, 116'). CA contact vias 176 and CA bars 178 are employed to provide electrical wiring among the transistors (112, 112', 114, 114', 116, 116'). One of the CA bars 178, which contacts one of the AA silicides 160 of the first pull-up PFET 116 as well as the gate top silicides 164 of the second pull-up PFET 116' as shown in FIG. 14B, provides electrical connection between the drain of the first pull-up PFET 116 and the gate of the second pull-up PFET 116'. Likewise, another CA bar 178 provides electrical connection between the drain of the second pull-up PFET 116' and the gate of the first pull-up PFET 116.

Figure 15A:
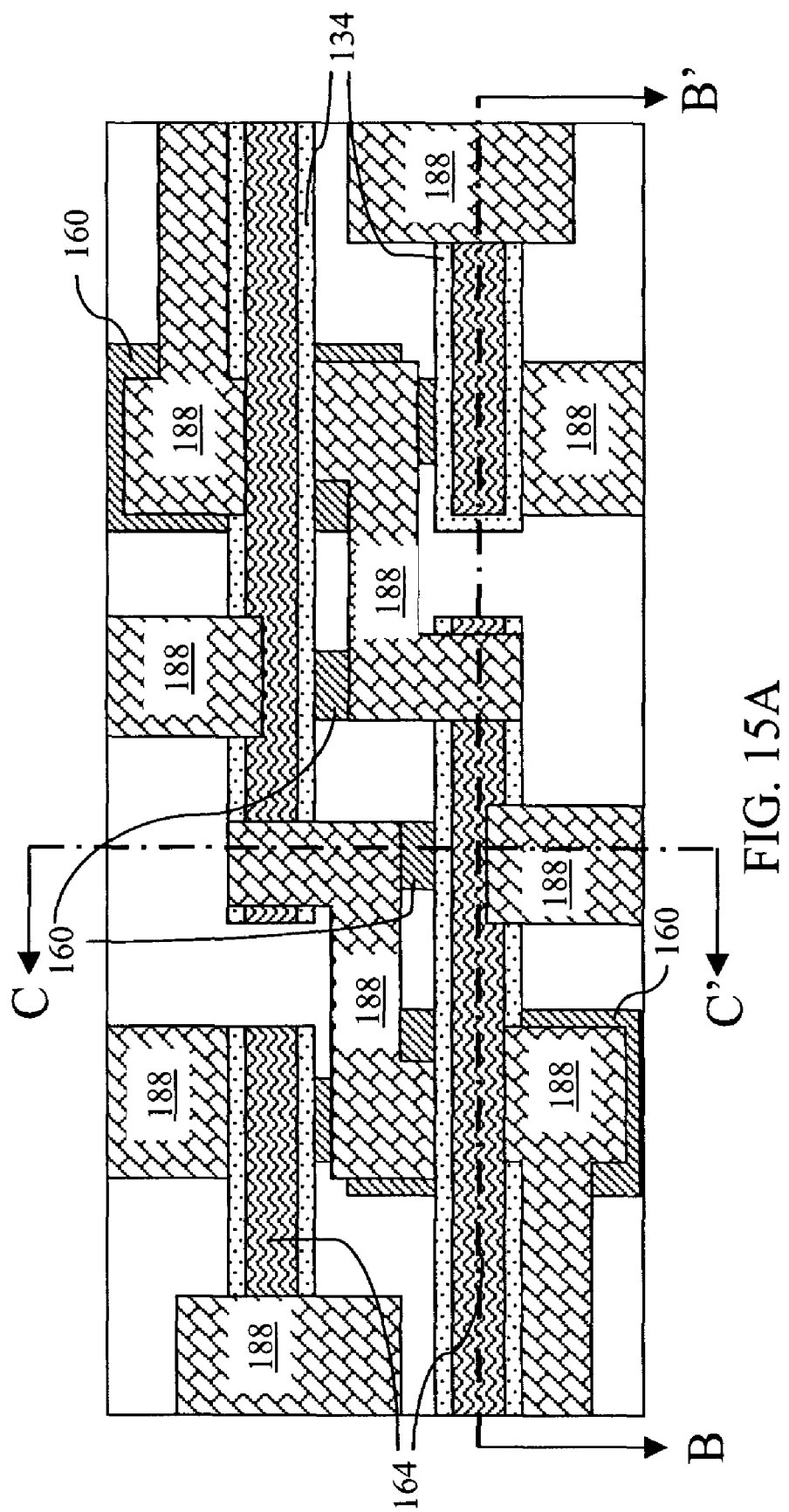
Figure 15B:
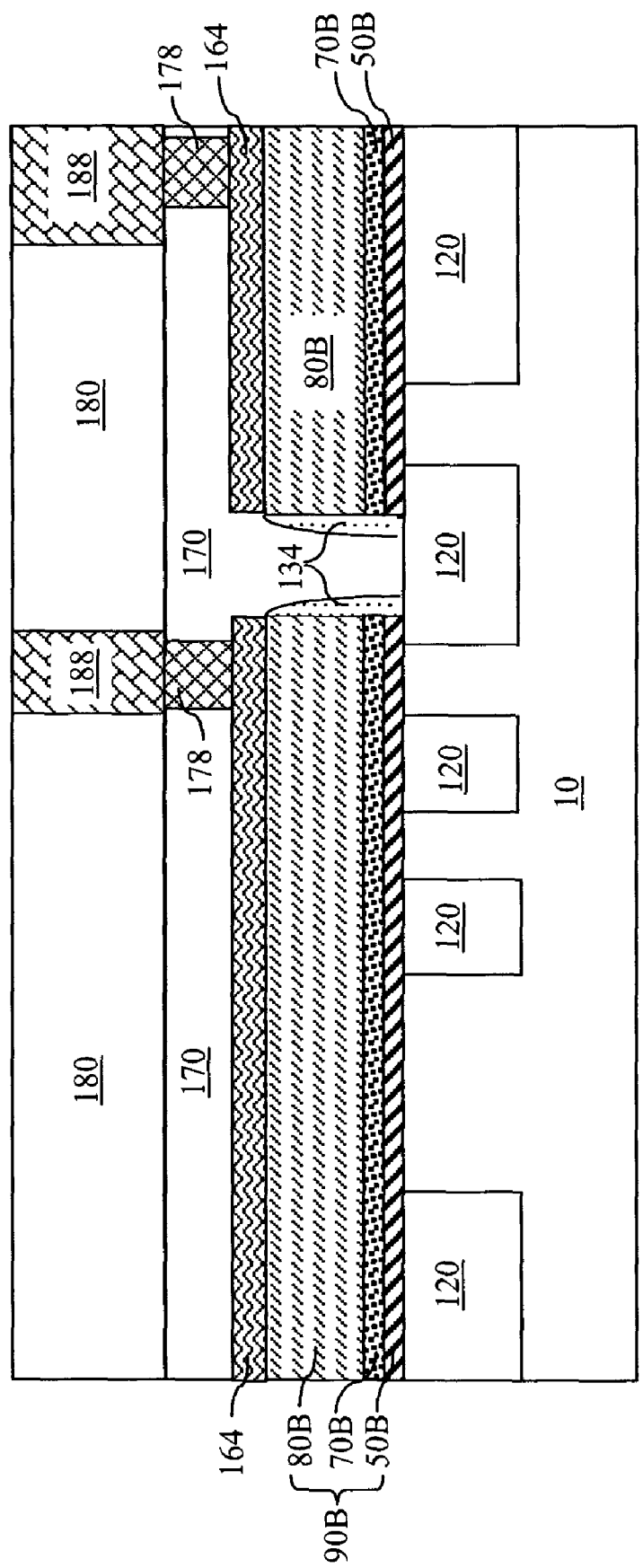
Figure 15C:
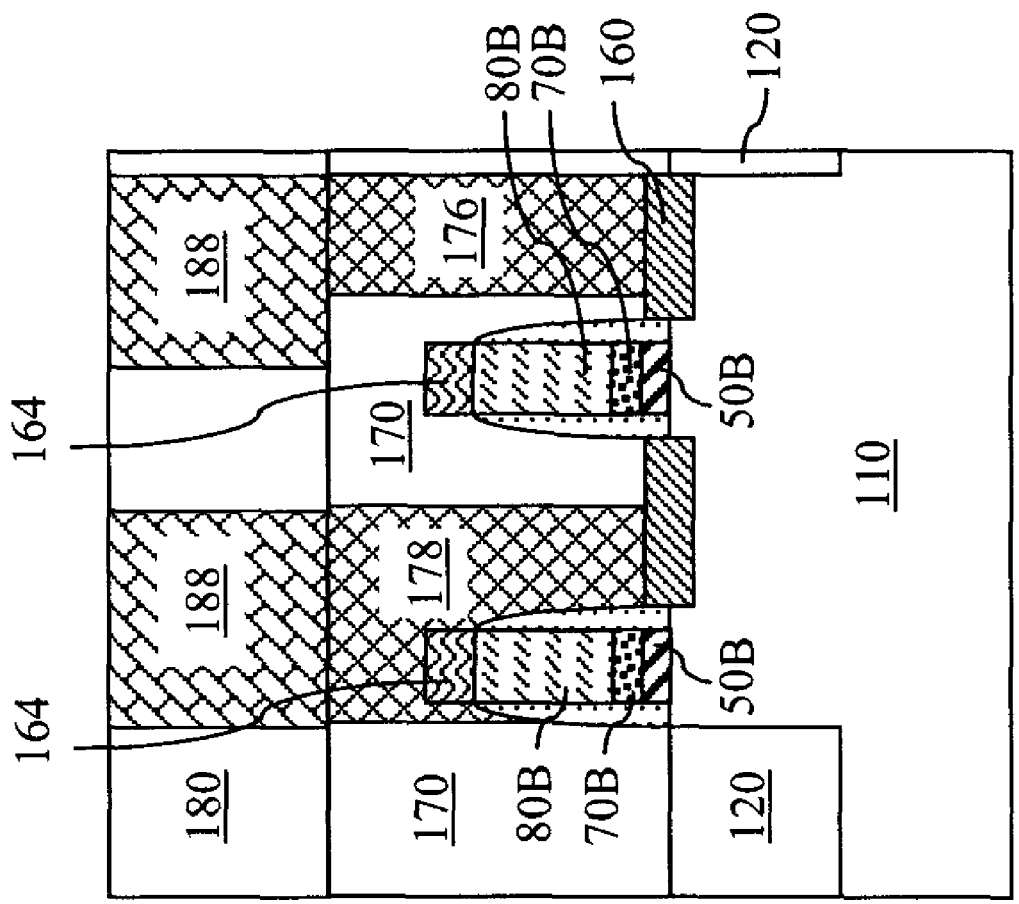

Referring to FIGS. 15A-15C, the exemplary SRAM cell is shown up to an M1 level, which is a first metal interconnect level. FIG. 15A is a top-down view of the exemplary SRAM cell up to the M1 level. The middle-of-line (MOL) dielectric 170 and an M1 dielectric 180 are not shown in FIG. 15A. FIG. 15B is a vertical cross-sectional view of the exemplary prior structure along the plane B-B' showing the MOL dielectric 170 and the M1 dielectric 180. FIG. 15C is a vertical cross-sectional view of the exemplary SRAM cell along the plane C-C' showing the MOL dielectric 170 and the M1 dielectric 180. M1 wires 188 embedded within the M1 dielectric 180 contact the underlying CA contact vias 176 and the CA bars 178. In the exemplary SRAM cell, the drain of each of the two pull-up transistors (116, 116') is electrically connected to a node at which a source/drain of one of the pass gate transistors (112, 112') adjoins the drain of one of the pull-down NFETs (114, 114') by a combination of a CA bar 178, an M1 wire 188, and a CA contact via 176. Two such combinations are present in each SRAM cell structure which comprises six transistors (112, 112', 114, 114', 116, 116').

Figure 16:
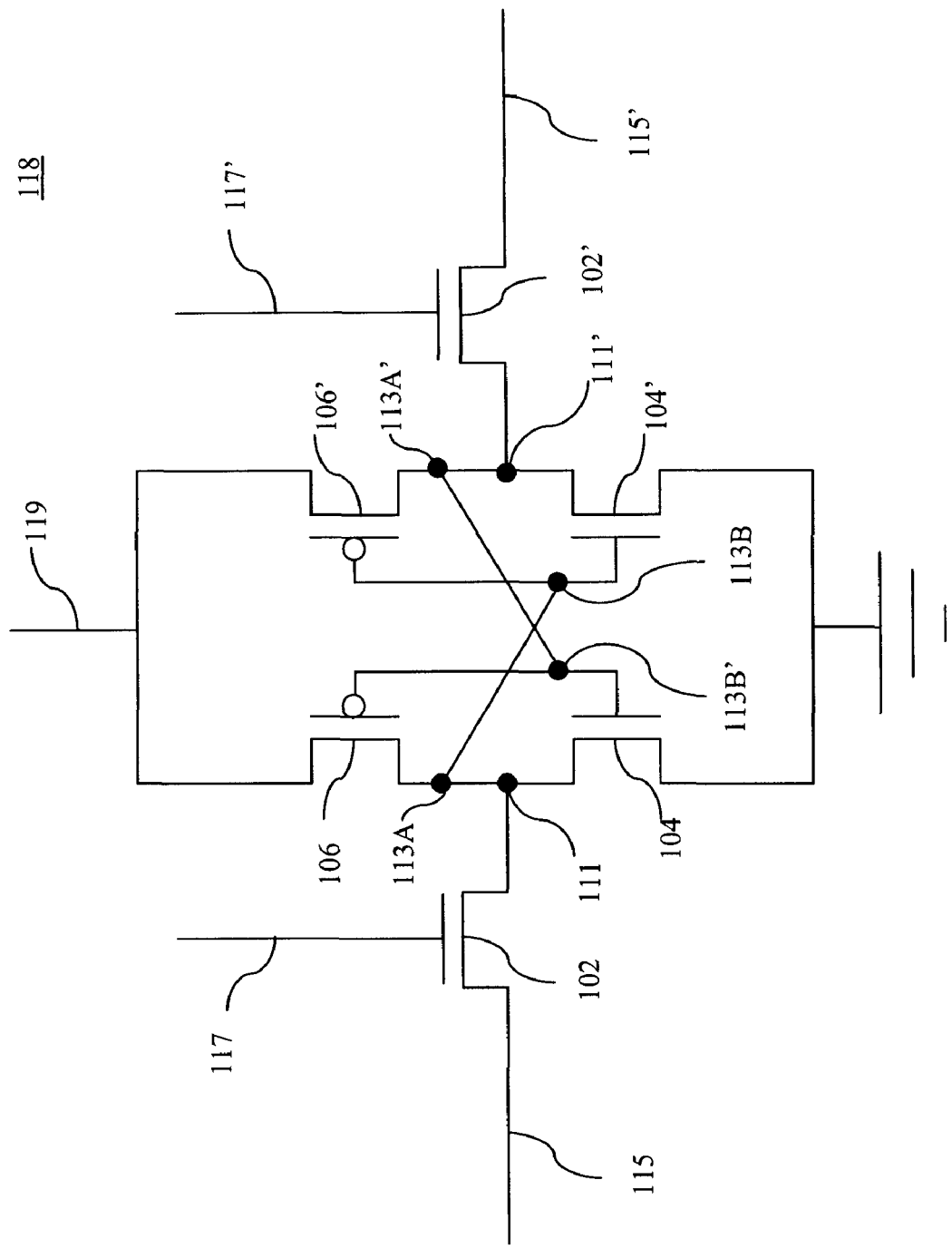
FIG. 16 is a circuit schematic for the exemplary SRAM structure.

Referring to FIG. 16, a circuit schematic 118 for the exemplary SRAM cell shows a first pair of a first pass gate n-type field effect transistor (NFET) 102 and a first pull-down n-type field effect transistor (NFET) 104. A first source/drain of the first pass gate NFET 102 and a first drain of the first pull down NFET 104 are adjoined to form an electrical connection. In the physical structure, this electrical connection is achieved by a first common active area that contains both the first source/drain of the first pass gate NFET 102 and the first drain of the first pull-down NFET 104. Similarly, a second source/drain of the second pass gate NFET 102' and a second drain of a second pull-down NFET 104' are adjoined to form another electrical connection. In the physical structure, this electrical connection is achieved by a second common active area that contains both the second source/drain of the second pass gate NFET 102' and the second drain of the second pull-down NFET 104'. The circuit schematic 118 further comprises a first pull-up p-type field effect transistor (PFET) 106 containing a third drain, which is physically a third active area, and a second pull-up PFET 106' containing a fourth drain, which is physically a fourth active area. Each of the source/drain nodes of the pass gate transistors (102, 102') may function F as a source or a drain depending on the operation of the SRAM circuit.

The third active area is electrically connected to the first active area via a collection of a first contact via, a first M1 wire, and a first CA bar. This connection is represented in the circuit schematic 118 by a first internal node 111. Similarly, the fourth active area is electrically connected to the second active area via a collection of a second contact via, a second M1 wire, and a second CA bar. This connection is represented in the circuit schematic 118 by a second internal node 111'. The gates of the second pull-up PFET 106' and the second pull-down NFET 104' are adjoined to the third drain of the first pull-up PFET 106 via the first CA bar. This connection is represented in the circuit schematic 118 by a third internal node 113A and a fourth internal node 113B. The gates of the first pull-up PFET 106 and the first pull-down NFET 104 are adjoined to the fourth drain of the second pull-up PFET 106' via the first CA bar. This connection is represented in the circuit schematic 118 by a fifth internal node 113A' and a sixth internal node 113B'. The internal nodes (111, 111', 113A, 113B, 113A', 113B') are connected by CA contact vias 176 and CA bars 178 as well as M1 wires 188. Bit line wiring (115, 115') and word line wiring (117, 117') are typically implemented at M2 and M3 levels.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a first gate stack, a second gate stack, a third gate stack, and a fourth gate stack, each located on a semiconductor substrate, wherein said second gate stack constitutes a gate of a p-type field effect transistor and said fourth gate stack constitutes a gate of an n-type field effect transistor, wherein said first gate stack comprises:
   a first high dielectric constant (high-k) material portion located on a first semiconductor portion of said semiconductor substrate;
   a metal oxide portion vertically contacting said first high-k material portion and comprising a different material than said high-k material; and
   a first conductive metal nitride portion vertically contacting said metal oxide portion and comprising a conductive metal nitride;
wherein said second gate stack comprises:
   a second high dielectric constant (high-k) material portion located on a second semiconductor portion of said semiconductor substrate; and
   a second conductive metal nitride portion vertically contacting said second high-k material portion and comprising said conductive metal nitride;
wherein said third gate stack comprises:
   a semiconductor oxide based gate dielectric portion located on a third semiconductor portion of said semiconductor substrate and comprising a semiconductor oxide or a semiconductor oxynitride;
wherein said fourth gate stack comprises:
   a third high dielectric constant (high-k) material portion located on a fourth semiconductor portion of said semiconductor substrate; and
   a third conductive metal nitride portion vertically contacting said third high-k material portion and comprising said conductive metal nitride; and
wherein said first, second, and third high-k material portions are composed of a high-k material having a same composition and a dielectric constant greater than 4.0, and said conductive metal nitride has a same composition in said first, second, and fourth gate stacks.

2. The semiconductor structure of claim 1, wherein said first device region includes a first semiconductor portion comprising a first semiconductor material, and wherein said second device region includes a second semiconductor portion comprising a second semiconductor material, and wherein said first gate stack has a first work function that is closer to one of band gap edges of said first semiconductor material than to a middle of band gap edges of said first semiconductor material, and wherein said second gate stack has a second work function that is closer to a middle of band gap edges of said second semiconductor material than to one of band gap edges of said second semiconductor material.

3. The semiconductor structure of claim 1, wherein said high-k material comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

4. The semiconductor structure of claim 1, wherein said metal oxide portion comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof wherein each value of x is independently from about 0.5 to about 3 and each value of y is independently from 0 to about 2.

5. The semiconductor structure of claim 1, wherein said first gate stack further comprises a first polycrystalline semiconductor material portion vertically contacting said first conductive metal nitride portion and comprising a polycrystalline semiconductor material, and wherein said second gate stack further comprises a second polycrystalline semiconductor material portion vertically contacting said second conductive metal nitride portion and comprising said polycrystalline semiconductor material.

6. The semiconductor structure of claim 5, wherein said polycrystalline semiconductor material and said another polycrystalline semiconductor material are different.

7. The semiconductor structure of claim 5, wherein said first semiconductor portion, said second semiconductor portion, and said third semiconductor portion comprise a same semiconductor material, and wherein said first gate stack has a first work function that is closer to a first band gap edge of said semiconductor material than to a middle of said first band gap edge and a second band gap edge of said semiconductor material, and wherein said second gate stack has a second work function that is closer to said middle of said band gap edges than to either of said band gap edges, and wherein said third gate stack has a third work function that is closer to said second band gap edge than said middle of said band gap edges, wherein said first band gap edge is one of a conduction band edge and a valence band edge and said second band gap edge is the other of said conduction band edge and said valence band edge.

8. The semiconductor structure of claim 7, wherein said first band gap is said conduction band, and said second band gap is said valence band, and wherein said semiconductor material comprises silicon.

9. The semiconductor structure of claim 1, wherein said third gate stack further comprises:
   a doped polycrystalline semiconductor material portion vertically contacting said semiconductor oxide based gate dielectric portion and comprising another polycrystalline semiconductor material; and
   a third polycrystalline semiconductor material portion vertically contacting said doped polycrystalline semiconductor material portion and comprising said polycrystalline semiconductor material.

10. The semiconductor structure of claim 9, wherein said fourth gate stack further comprises a fourth polycrystaltine semiconductor material portion vertically contacting said third conductive metal nitride portion and comprising said polycrystalline semiconductor material.

11. A semiconductor structure comprising:
   at least one first conductivity type field effect transistor located on a semiconductor substrate;
   at least one second conductivity type field effect transistor located on said semiconductor substrate, wherein said second conductivity type is the opposite of said first conductivity type; and
   at least one static random access memory (SRAM) cell located on said semiconductor substrate,
wherein said at least one first conductivity type field effect transistor includes a first gate stack including:

a first high dielectric constant (high-k) material portion located on a first semiconductor portion of said semiconductor substrate and composed of a high-k material having a dielectric constant greater than 4.0;

a metal oxide portion vertically contacting said first high-k material portion and comprising a different material than said high-k material;

a first conductive metal nitride portion vertically contacting said metal oxide portion and comprising a conductive metal nitride; and a first polycrystalline semiconductor material portion vertically contacting said first conductive metal nitride portion and comprising a polycrystalline semiconductor material, and wherein said at least one second conductivity type field effect transistor includes a second gate stack including:

a semiconductor oxide based gate dielectric portion located on a second semiconductor portion of said semiconductor substrate and comprising a semiconductor oxide or a semiconductor oxynitride;

a doped polycrystalline semiconductor material portion vertically contacting said semiconductor oxide based gate dielectric portion and comprising another polycrystalline semiconductor material; and a second polycrystalline semiconductor material portion vertically contacting said doped polycrystalline semiconductor material portion and comprising said polycrystalline semiconductor material, and wherein each of said at least one static random access memory cell is located on a third semiconductor portion of said semiconductor substrate and includes:

a pair of pull-down n-type field effect transistor;

a pair of pull-up p-type field effect transistor; and a pair of pass gate n-type field effect transistor, wherein each of said six field effect transistors comprises a third gate stack comprising:

a second high dielectric constant (high-k) material portion composed of said high-k material;

a second conductive metal nitride portion vertically contacting said second high-k material portion and comprising said conductive metal nitride; and a second polycrystalline semiconductor material portion vertically contacting said second conductive metal nitride portion and comprising said polycrystalline semiconductor material.

12. The semiconductor structure of claim 11, wherein said first semiconductor portion, said second semiconductor portion, and said third semiconductor portion comprise a same semiconductor material, wherein said first gate stack has a first work function that is closer to a first band gap edge of said semiconductor material than to a middle of said first band gap edge and a second band gap edge of said semiconductor material, and wherein said second gate stack has a second work function that is closer to said second band gap edge than said middle of said band gap edges, and wherein said third gate stack has a third work function that is closer to said middle of said band gap edges than to either of said band gap edges, wherein said first band gap edge is one of a conduction band edge and a valence band edge and said second band gap edge is the other of said conduction band edge and said valence band edge.

13. A semiconductor structure comprising:

at least one first conductivity type field effect transistor located on a semiconductor substrate;

at least one second conductivity type field effect transistor located on said semiconductor substrate, wherein said second conductivity type is the opposite of said first conductivity type; and at least one dynamic random access memory (DRAM) cell located on said semiconductor substrate, wherein said at least one first conductivity type field effect transistor includes a first gate stack including:

a first high dielectric constant (high-k) material portion located on a first semiconductor portion of said semiconductor substrate and composed of a high-k material having a dielectric constant greater than 4.0;

a metal oxide portion vertically contacting said first high-k material portion and comprising a different material than said high-k material;

a first conductive metal nitride portion vertically contacting said metal oxide portion and comprising a conductive metal nitride; and a first polycrystalline semiconductor material portion vertically contacting said first conductive metal nitride portion and comprising a polycrystalline semiconductor material, and wherein said at least one second conductivity type field effect transistor includes a second gate stack including:

a semiconductor oxide based gate dielectric portion located on a second semiconductor portion of said semiconductor substrate and comprising a semiconductor oxide or a semiconductor oxynitride;

a doped polycrystalline semiconductor material portion vertically contacting said semiconductor oxide based gate dielectric portion and comprising another polycrystalline semiconductor material; and a second polycrystalline semiconductor material portion vertically contacting said doped polycrystalline semiconductor material portion and comprising said polycrystalline semiconductor material, and wherein each of said at least one dynamic random access memory cell is located on a third semiconductor portion of said semiconductor substrate and includes:

a second high dielectric constant (high-k) material portion composed of said high-k material;

a second conductive metal nitride portion vertically contacting said second high-k material portion and comprising said conductive metal nitride; and a second polycrystalline semiconductor material portion vertically contacting said second conductive metal nitride portion and comprising said polycrystalline semiconductor material.

14. The semiconductor structure of claim 13, wherein said first semiconductor portion, said second semiconductor portion, and said third semiconductor portion comprise a same semiconductor material, wherein said first gate stack has a first work function that is closer to a first band gap edge of said semiconductor material than to a middle of said first band gap edge and a second band gap edge of said semiconductor material, and wherein said second gate stack has a second work function that is closer to said second band gap edge than said middle of said band gap edges, and wherein said third gate stack has a third work function that is closer to said middle of said band gap edges than to either of said band gap edges, wherein said first band gap edge is one of a conduction band edge and a valence band edge and said second band gap edge is the other of said conduction band edge and said valence band edge.

* * * * *